US012635053B2

(12) United States Patent
Miura et al.

(10) Patent No.: US 12,635,053 B2
(45) Date of Patent: May 19, 2026

(54) LIGHT-EMITTING ELEMENT DRIVING DEVICE

(71) Applicant: ROHM CO., LTD., Kyoto (JP)

(72) Inventors: Keisuke Miura, Kyoto (JP); Koji Katsura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 35 days.

(21) Appl. No.: 18/895,847

(22) Filed: Sep. 25, 2024

(65) Prior Publication Data

US 2025/0024573 A1    Jan. 16, 2025

Related U.S. Application Data

(63) Continuation of application No. PCT/JP2022/047961, filed on Dec. 26, 2022.

(30) Foreign Application Priority Data

Mar. 30, 2022    (JP) ................................. 2022-055011
Mar. 30, 2022    (JP) ................................. 2022-055015

(51) Int. Cl.
*H05B 45/52*    (2020.01)
*G01R 31/68*    (2020.01)

(52) U.S. Cl.
CPC ............. *H05B 45/52* (2020.01); *G01R 31/68* (2020.01)

(58) Field of Classification Search
CPC ......... G01R 31/52; H05B 45/52; H05B 45/50
See application file for complete search history.

(56) References Cited

U.S. PATENT DOCUMENTS

| | | | | |
|---|---|---|---|---|
| 10,426,012 B2* | 9/2019 | Yanagizu | ............... | H05B 47/20 |
| 11,924,941 B2* | 3/2024 | Takagimoto | ........... | H05B 47/16 |
| 12,136,384 B2* | 11/2024 | Sasaki | ...................... | G09G 3/32 |
| 2018/0146523 A1* | 5/2018 | Nakatani | ............... | H05B 45/54 |

FOREIGN PATENT DOCUMENTS

JP        2016-175582        10/2016

OTHER PUBLICATIONS

International Search Report and Written Opinion in International Appln. No. PCT/JP2022/047961, mailed on Mar. 7, 2023, 17 pages (with machine translation).

\* cited by examiner

*Primary Examiner* — Patrick C Chen
(74) *Attorney, Agent, or Firm* — Fish & Richardson P.C.

(57)        ABSTRACT

For each channel, a light-emitting unit provided between a wire fed with a driving voltage and a connection terminal can be supplied with a driving current via the connection terminal. For each channel, a switch circuit is provided between the connection terminal and a voltage generation circuit. Based on the driving voltage, a first and a second voltage lower than the driving voltage are generated at a first and a second node. With each connection terminal cut off from the first and second nodes, the second voltage is lower than the first voltage. In a period in which each channel is not supplied with the driving current, the switch circuit operates to connect, of two adjacent connection terminals, one to the second node and the other to the first node. Based on the voltage at the one connection terminal, a resistance value abnormality between the two connection terminals is detected.

11 Claims, 14 Drawing Sheets

```
        ┌─────────┐
        │  START  │
        └─────────┘
             │
             ▼
    ┌──────────────────┐
 S1 │  INITIAL CHECK   │
    │    OPERATION     │
    └──────────────────┘
             │
             ▼
    ┌──────────────────┐
 S2 │ SETTING OPERATION│
    └──────────────────┘
             │
             ▼
    ┌──────────────────┐
 S3 │  REGULAR LIGHT   │
    │ EMISSION OPERATION│
    └──────────────────┘
```

SD3

1

SD2 →

← SD1

SD4

EVALUATION STATE $ST_{1A}$

NORMAL CONDITION $V_{CH}[2]=V1_{SET}$ $\vee$ $V_{REF}$ $\vee$ $V_{CH}[1]=V2_{SET}$

SHORT-CIRCUITED CONDITION $V_{CH}[1]=V_{CH}[2]=V1_{SET}$ $\vee$ $V_{REF}$

TERMINAL ARRAY AR

| | | CHANNEL | | | |
|---|---|---|---|---|---|
| | | 1ST | 2ND | 3RD | 4TH |
| 1ST EVALUATION STATE | SW_H | OFF | ON | ON | ON |
| | SW_L | ON | OFF | OFF | OFF |
| 2ND EVALUATION STATE | SW_H | ON | OFF | ON | ON |
| | SW_L | OFF | ON | OFF | OFF |
| 3RD EVALUATION STATE | SW_H | ON | ON | OFF | ON |
| | SW_L | OFF | OFF | ON | OFF |
| 4TH EVALUATION STATE | SW_H | ON | ON | ON | OFF |
| | SW_L | OFF | OFF | OFF | ON |

FIG.12

| | | CHANNEL | | | |
|---|---|---|---|---|---|
| | | 1ST | 2ND | 3RD | 4TH |
| 1ST EVALUATION STATE | SW_H | OFF | ON | OFF | OFF |
| | SW_L | ON | OFF | OFF | OFF |
| 2ND EVALUATION STATE | SW_H | ON | OFF | ON | OFF |
| | SW_L | OFF | ON | OFF | OFF |
| 3RD EVALUATION STATE | SW_H | OFF | ON | OFF | ON |
| | SW_L | OFF | OFF | ON | OFF |
| 4TH EVALUATION STATE | SW_H | OFF | OFF | ON | OFF |
| | SW_L | OFF | OFF | OFF | ON |

| CHANNEL | 1ST | 2ND | 3RD | 4TH | 5TH | 6TH | 7TH | 8TH |
|---|---|---|---|---|---|---|---|---|
| SW_H | OFF | ON | OFF | ON | OFF | ON | OFF | ON |
| SW_L | ON | OFF | ON | OFF | ON | OFF | ON | OFF |

NORMAL CONDITION

SHORT-CIRCUITED CONDITION

LIGHT-EMITTING ELEMENT DRIVING DEVICE

CROSS-REFERENCE TO RELATED APPLICATIONS

This nonprovisional application is a continuation application of International Patent Application No. PCT/JP2022/047961 filed on Dec. 26, 2022, which claims priority to Japanese Patent Applications No. 2022-055011 and No. 2022-055015 filed on Mar. 30, 2022, the entire contents of which are hereby incorporated by reference.

TECHNICAL FIELD

The present disclosure relates to light-emitting element driving devices.

BACKGROUND ART

Light-emitting element driving devices are widely used to drive light-emitting units employing light-emitting diodes (LEDs) or the like. LED drivers are a kind of light-emitting element driving device. A light-emitting element driving device is provided with a plurality of connection terminals. Each connection terminal has a light-emitting unit connected to it so that, via the connection terminal, a driving current is supplied to the light-emitting unit to make it emit light.

CITATION LIST

Patent Literature

Patent Document 1: JP-A-2016-175582

BRIEF DESCRIPTION OF DRAWINGS

FIG. 11 is a diagram showing a plurality of evaluation states in the initial detection process according to Practical Example EX1_B belonging to the embodiment of the present disclosure.

FIG. 12 is a diagram showing a plurality of evaluation states in the initial detection process according to Practical Example EX1_B belonging to the embodiment of the present disclosure.

FIG. 13 is a diagram showing an evaluation state in the initial detection process according to Practical Example EX1_C belonging to the embodiment of the present disclosure.

DESCRIPTION OF EMBODIMENTS

Figure 1:
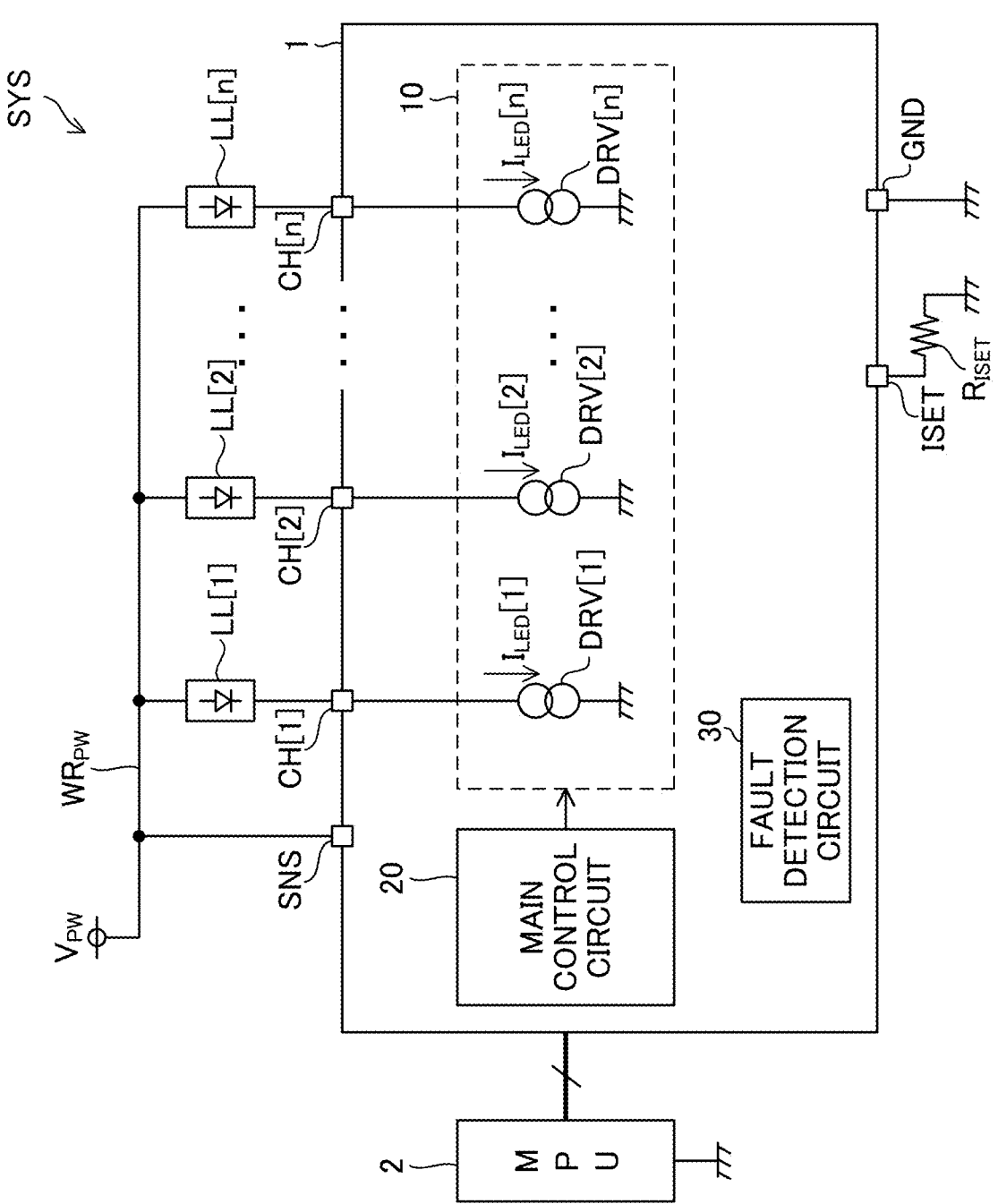
FIG. 1 is an overall configuration diagram of a light-emitting system according to an embodiment of the present disclosure.

Examples of implementing the present disclosure will be described below specifically with reference to the accompanying drawings. Among the diagrams referred to in the course, the same parts are identified by the same reference signs, and in principle no overlapping description of the same parts will be repeated. In the present description, for the sake of simplicity, symbols and reference signs referring to information, signals, physical quantities, functional blocks, circuits, elements, parts, and the like are occasionally used with omission or abbreviation of the names of the information, signals, physical quantities, functional blocks, circuits, elements, parts, and the like corresponding to those symbols and reference signs. For example, the high-side switch described later and identified by the reference sign "SW_H" (see FIG. 6) is sometimes referred to as the high-side switch SW_H and other times abbreviated to the switch SW_H, both referring to the same entity.

First, some of the terms used to describe embodiments of the present disclosure will be defined. "Ground" denotes a reference conductor at a reference potential of 0 V (zero volts), or to a potential of 0 V itself. A reference conductor can be formed of an electrically conductive material such as metal. A potential of 0 V is occasionally referred to as a ground potential. In embodiments of the present disclosure, any voltage mentioned with no particular reference mentioned is a potential relative to the ground.

"Level" denotes the level of a potential, and for any signal or voltage of interest, "high level" is a potential higher than "low level". For any signal or voltage of interest, its being at high level means, more precisely, its level being equal to high level, and its being at low level means, more precisely, its level being equal to low level. A level with respect to a signal is occasionally referred to as a signal level, and a level with respect to a voltage is occasionally referred to as a voltage level. For any signal that takes as its signal level either high or low level, a period in which the signal takes as its level high level is referred to as a high-level period, and a period in which the signal takes as its level low level is referred to as a low-level period. Similar definitions apply to any voltage that takes as its voltage level either high or low level.

For any signal or voltage of interest, a switch from low level to high level is termed an up edge. "Up edge" can be read as "rising edge". Likewise, for any signal or voltage of interest, a switch from high level to low level is termed a down edge. "Down edge" can be read as "falling edge".

Any switch can be configured with one or more FETs (field-effect transistors). When a given switch is in the on state, the switch conducts across its terminals; when a given switch is in the off state, the switch does not conduct (that is, it is cut-off) across its terminals. In the following description, for any switch, its being in the on or off state is occasionally expressed simply as its being on or off respectively.

Unless otherwise stated, wherever "connection" is mentioned among a plurality of parts constituting a circuit, as among given circuit elements, wires, nodes, and the like, the term is to be understood to denote "electrical connection".

FIG. 1 is an overall configuration diagram of a light-emitting system SYS according to one embodiment of the present disclosure. The light-emitting system SYS includes an LED driver 1 as one example of a light-emitting element driving device, an MPU (microprocessor unit) 2 for controlling the LED driver 1, and a plurality of light-emitting units driven by the LED driver 1. Where no distinction is made among the plurality of light-emitting units in the light-emitting system SYS, any of them can be referred to as the light-emitting unit LL.

The MPU 2 is a device external to the LED driver 1. Wires laid outside the LED driver 1 will be referred to as external wires. The LED driver 1 is connected to the MPU 2 via one or more external wires, and this permits desired exchange of signals between the LED driver 1 and the MPU 2.

As a supply voltage for driving the light-emitting units LL, a driving voltage $V_{PW}$ is generated in the light-emitting system SYS and the driving voltage $V_{PW}$ is applied to the wire $WR_{PW}$. The driving voltage $V_{PW}$ is a positive direct-current voltage. The LED driver 1 has a sense terminal SNS for monitoring the driving voltage $V_{PW}$. The sense terminal SNS is connected to the wire $WR_{PW}$ to receive the driving voltage $V_{PW}$. While the LED driver 1 includes some circuits that are connected to the sense terminal SNS, these circuits are omitted from illustration in FIG. 1 (those circuits will be described in detail later).

From an unillustrated voltage source, one or more supply voltages (positive direct-current voltages) are supplied to the LED driver 1 and the circuits in the LED driver 1 operate based on the so supplied supply voltages. The driving voltage $V_{PW}$ can be one of those one or more supply voltages. The LED driver 1 has a ground terminal GND that is connected to a ground and the circuits in the LED driver 1 can operate relative to the ground potential.

Each light-emitting unit LL is configured with one or more LEDs (light-emitting diodes), but can be configured with a single LED. Or each light-emitting unit LL can be configured with a parallel circuit or a series circuit of a plurality of LEDs. A series circuit of a plurality of LEDs and a parallel circuit of a plurality of LEDs can be mixedly used in a single light-emitting unit LL. In any case, each light-emitting unit LL has a high-potential terminal and a low-potential terminal, and the LEDs that constitute the light-emitting unit LL each have its forward direction pointing from the high-potential terminal to the low-potential terminal. The high-potential terminal of each light-emitting unit LL is connected to the wire $WR_{PW}$.

It is here assumed that the light-emitting system SYS includes, as the plurality of light-emitting units LL, a total of n light-emitting units LL. The n light-emitting units LL are identified by the symbols "LL[1]" to "LL[n]". Here, n is any integer of two or more such that, for example, n=8, or n=16, or n=24. Of the light-emitting units LL[1] to LL[n], one given light-emitting unit LL is identified as the light-emitting unit LL[i] using any integer i that fulfills 1≤i≤n. In the light-emitting system SYS and in the LED driver 1, a first to an nth channel are defined. The light-emitting unit LL[i] belongs to the ith channel (in other words, it corresponds to the ith channel). Of the light-emitting units LL[1] to LL[n], any two or more light-emitting units LL can be configured differently. In the following description, it is assumed that the light-emitting units LL[1] to LL[n] are configured identically.

The LED driver 1 is provided with as many connection terminals CH[1] to CH[n] as the total number of channels. Where no distinction is made among the connection terminals CH[1] to CH[n], any of them can be referred to as the connection terminal CH. The connection terminal CH[i] belongs to the ith channel (in other words, it corresponds to the ith channel). The connection terminal CH[i] is a light-emitting unit connection terminal to be connected to the light-emitting unit LL[i] and, for any integer i that fulfills "1≤i≤n, the low-potential terminal of the light-emitting unit LL[i] is connected to the connection terminal CH[i]. In a case where the light-emitting unit LL[i] is configured with a single LED or a parallel circuit of a plurality of LEDs, the anode(s) of the LED(s) in the light-emitting unit LL[i] is connected to the wire $WR_{PW}$ and the cathode(s) of the LED(s) in the light-emitting unit LL[i] is connected to the connection terminal CH[i]. In a case where the light-emitting unit LL[i] is configured with a series circuit of a plurality of LEDs, the anode of the LED at the high-potential end in the light-emitting unit LL[i] is connected to the wire $WR_{PW}$ and the cathode of the LED at the low-potential end in the light-emitting unit LL[i] is connected to the connection terminal CH[i].

The LED driver 1 includes a drive circuit 10, a main control circuit 20, and a fault detection circuit 30. The fault detection circuit 30 can be understood to be a circuit incorporated in the drive circuit 10.

The drive circuit 10 includes, as an example of a driving current supply circuit, current drivers DRV[1] to DRV[n]. The current driver DRV[i] belongs to the ith channel (in other words, it corresponds to the ith channel). That is, the drive circuit 10 includes current drivers one for each channel. Where no distinction is made among a total of n current drivers provided one for each channel, any of them can be referred to as the current driver DRV. The current drivers DRV[1] to DRV[n] are configured identically and function identically. In each channel, the current driver DRV[i] includes a constant current circuit and operates, under the control of the main control circuit 20, such that a driving current $I_{LED}[i]$ passes from the connection terminal CH[i] to the ground. The driving current $I_{LED}[i]$ passes from the wire $WR_{PW}$ via the light-emitting unit LL[i] and the connection terminal CH[i] to the ground. The driving current $I_{LED}[1]$ passing through the light-emitting unit LL[1] causes the light-emitting unit LL[1] to emit light, and the driving current $I_{LED}[2]$ passing through the light-emitting unit LL[2] causes the light-emitting unit LL[2] to emit light. Similar descriptions apply to the other driving currents and the other light-emitting units. Where no distinction is made among the driving currents $I_{LED}[1]$ to $I_{LED}[n]$, any of them can be referred to as the driving current $I_{LED}$.

It can be understood as follows: the LED driver 1 has a first to an nth channel circuit that are configured identically, and the ith channel circuit includes a connection terminal CH[i] and a current driver DRV[i].

The main control circuit 20 controls the operation of the current drivers DRV[1] to DRV[n]. The main control circuit 20 can control the operation of the current drivers DRV[1] to DRV[n] according to a signal received from the MPU 2. The LED driver 1 is provided with a setting terminal ISET. Outside the LED driver 1, a current setting resistor $R_{ISET}$ is provided, with one terminal of the current setting resistor $R_{ISET}$ connected to the setting terminal ISET and the other terminal of the current setting resistor $R_{ISET}$ connected to the ground. Based on the value of the current setting resistor $R_{ISET}$, the main control circuit 20 sets the magnitudes of the driving currents $I_{LED}[1]$ to $I_{LED}[n]$. The main control circuit 20 can set the magnitudes of the driving currents $I_{LED}[1]$ to $I_{LED}[n]$ individually based on the value of the current setting resistor $R_{ISET}$ and a command from the MPU 2.

Figure 2:
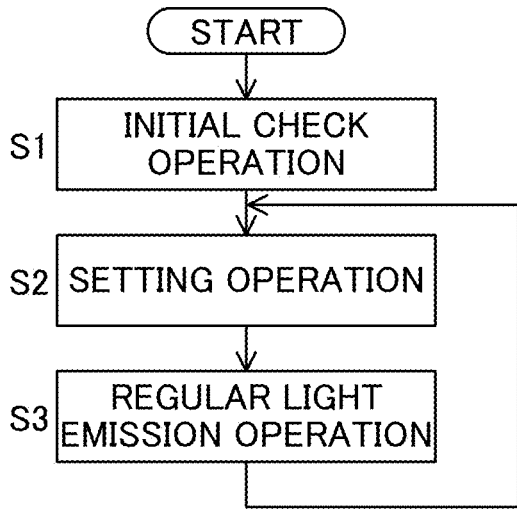
FIG. 2 is a flow chart showing an outline of the operation of an LED driver according to the embodiment of the present disclosure.

FIG. 2 is a flow chart showing an outline of the operation of the LED driver 1. When a supply voltage for driving the LED driver 1 starts to be fed to it, the LED driver 1 starts up. Then, first, at Step S1, initial check operation is performed. In the initial check operation, the fault detection circuit 30 checks for the presence of various faults. The functions of the fault detection circuit 30 will be described later. Subsequent to Step S1, at Step S2, setting operation is performed. Here, depending on the kind of fault detected in the initial check operation, no advance can be made from Step S1 to Step S2. In the setting operation at Step S2, based on a command received from the MPU 2, the main control circuit 20 makes various settings in connection with the driving of the LED driver 1. For example, in the setting operation at Step S2, settings are made in connection with the magnitudes of the driving currents $I_{LED}[1]$ to $I_{LED}[n]$, the operation to be performed on detection of a fault, and the like. Step S2 is followed by Step S3.

At Step S3, regular light emission operation is performed. Before Step S3, under the control of the main control circuit 20, the current drivers DRV[1] to DRV[n] all remain halted from driving and thus the driving currents $I_{LED}[1]$ to $I_{LED}[n]$ are kept zero. In the regular light emission operation, under the control of the main control circuit 20, for each channel, a driving current $I_{LED}$ is supplied to the light-emitting unit LL, which thus emits light.

For example, in the regular light emission operation, the main control circuit 20 drives, for each channel, the current driver DRV by PWM. "PWM" is short for pulse-width modulation. In PWM driving, for each channel, the time width (in other words, length of time) for which the driving current $I_{LED}[i]$ is supplied is controlled. That is, the time widths for which the driving currents $I_{LED}[1]$ to $I_{LED}[n]$ are supplied are individually PWM-controlled. In this way, the light-emitting units LL emit light pulsewise and, through control of the just mentioned time widths, the average luminance of the light-emitting units LL is individually adjusted. Step S3 is followed by a return to Step S2, so that steps S2 and S3 are repeated.

Figure 3:
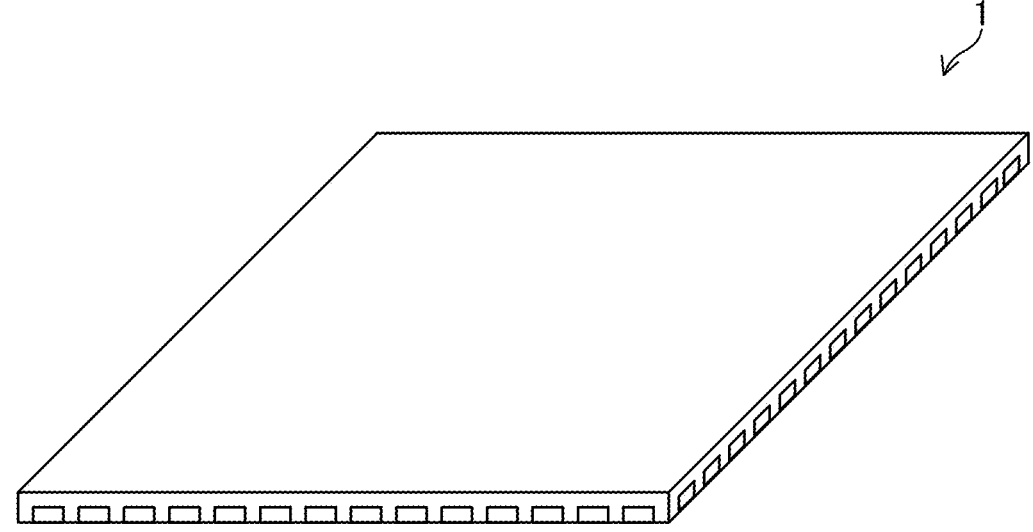
FIG. 3 is an exterior perspective view of the LED driver according to the embodiment of the present disclosure.

FIG. 3 is an exterior perspective view of the LED driver 1. The LED driver 1 is an electronic component that includes a semiconductor chip having a semiconductor integrated circuit formed on a semiconductor substrate, a package (case) housing the semiconductor chip, and a plurality of external terminals exposed out of the package to outside the LED driver 1. Sealing the semiconductor chip in the package (case) formed of resin yields the LED driver 1. The circuits in the LED driver 1 are formed inside the semiconductor integrated circuit mentioned above. The connection terminals CH[1] to CH[n], the sense terminal SNS, the setting terminal ISET, and the ground terminal GND are among the plurality of external terminals provided on the LED driver 1. Other than these, various external terminals (supply terminals, communication terminals, etc.) that are not shown in FIG. 1 are provided on the LED driver 1.

Figures 4, 5:
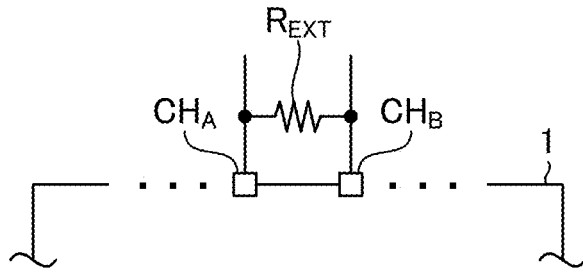
FIG. 4 is a plan view of the LED driver according to the embodiment of the present disclosure.
FIG. 5 is a diagram showing how a resistive component forms from foreign matter or the like between adjacent connection terminals in connection with the present disclosure.

In the example taken here, the LED driver 1 has a package called QFN (quad flat no-lead). In this case, the LED driver 1 has a package substantially in the shape of a rectangular parallelepiped, and has a plurality of external terminals arrayed along each of the four sides SD1 to SD4 of the face constituting the bottom face of the package (FIG. 4 is a plan view as seen from the bottom face). The LED driver 1 can have any type of package other than QFN, examples including DFN (dual flat no-lead) and SOP (small outline package).

The bottom face of the package of the LED driver 1 has a rectangular shape (which can be square). The four sides of the rectangular shape comprise sides SD1 and SD2 that lie opposite each other and sides SD3 and SD4 that lie opposite each other. The external terminals of the LED driver 1 are each arranged at one of the sides SD1 to SD4. With attention paid to the connection terminals CH[1] to CH[n], these connection terminals CH[1] to CH[n] are arranged at, so as to be distributed among, one or more of the sides SD1 to SD4. For example, if n=24, the connection terminals CH[1] to CH[8] can be arranged along the side SD1, the connection terminals CH[9] to CH[16] can be arranged along the side SD2, and the connection terminals CH[17] to CH[24] can be arranged along the side SD3.

If two given connection terminals CH are arranged along the same side (e.g., SD1) so as to be adjacent to each other, the two connection terminals CH may be short-circuited with solder, condensed moisture, or the like, or may be, though not quite short-circuited, connected together across a considerably low resistive component. Such states will here be referred to as resistance value abnormalities.

As shown in FIG. 5, two given connection terminals CH that are arranged along the same side (e.g., SD1) so as to be adjacent to each other will be referred to as connection terminals $CH_A$ and $CH_B$. No other external terminal is arranged between the connection terminals $CH_A$ and $CH_B$. In FIG. 5, the resistance identified by the symbol "$R_{EXT}$" is not a resistor that is purposefully provided in the light-emitting system SYS but is a resistive component that has unexpectedly come to be present between the connection terminals $CH_A$ and $CH_B$ outside the LED driver 1. The resistance $R_{EXT}$ results from, for example, solder that, when the LED driver 1 is mounted on a circuit board (not shown), is unintentionally left between the connection terminals $CH_A$ and $CH_B$ on the circuit board, or moisture that can form between the connection terminals $CH_A$ and $CH_B$ by condensation or the like, or foreign matter that can deposit between the connection terminals $CH_A$ and $CH_B$ due to soil or the like.

A resistance value abnormality at the connection terminals $CH_A$ and $CH_B$ is an abnormality in the resistance value between the connection terminals $CH_A$ and $CH_B$ (i.e., the value of the resistance $R_{EXT}$), and is more specifically a fault in which the resistance value between the connection terminals $CH_A$ and $CH_B$ (i.e., the value of the resistance $R_{EXT}$) becomes equal to or lower than a predetermined value. A state where the connection terminals $CH_A$ and $CH_B$ are short-circuited together corresponds to a state where the value of the resistance $R_{EXT}$ is considerably low, and thus constitutes a resistance value abnormality.

The fault detection circuit 30 (see FIG. 1) executes a fault detection process, which is a process for detecting a resistance value abnormality. More precisely, detecting a resistance value abnormality denotes detecting the presence or absence of a resistance value abnormality. The fault detection circuit 30 executes, as the fault detection process, an initial detection process α, which is a first fault detection process, and a regular detection process β, which is a second fault detection process.

The initial detection process α is a process that is executed during the initial check operation (i.e., a process executed at Step S1 in FIG. 2). Accordingly, during the execution period of the initial detection process α, the current drivers DRV[1] to DRV[n] all remain halted from driving. That is, the initial detection process α is executed in a period with no supply of the driving currents $I_{LED}[1]$ to $I_{LED}[n]$.

The regular detection process β is a process that is executed during a period in which the regular light emission operation is performed (i.e., a process executed at Step S3 in FIG. 2). The regular detection process β is executed during a period in which the current drivers DRV are PWM-driven. That is, the regular detection process β is executed in a period in which the light-emitting units LL are supplied with pulse-width-modulated currents as the driving current $I_{LED}$.

The result of detecting a resistance value abnormality can be used in any way. For example, if in the initial detection process α or in the regular detection process β a resistance value abnormality is detected to be present, the main control circuit 20 or the fault detection circuit 30 can transmit a predetermined error signal to the MPU 2. The error signal here indicates that a resistance value abnormality is judged to be present or that some fault is detected to have occurred in the LED driver 1. Moreover, if in the initial detection process α or in the regular detection process β a resistance value abnormality is judged to be present, the main control circuit 20 or the fault detection circuit 30 can store corresponding data in a register (unillustrated) within the LED driver 1. The MPU 2 can, by transmitting a predetermined read command to the LED driver 1, read data from the register in the LED driver 1.

In a case where in the initial detection process α or in the regular detection process β a resistance value abnormality is judged to be present, detection may be performed so as to identify (distinguish) between which connection terminals it is present. Specifically, for example, in a case where the connection terminals CH[1] and CH[2] are adjacent to each other and the connection terminals CH[2] and CH[3] are adjacent to each other, detection may be performed so as to distinguish the presence or absence of a resistance value abnormality between the connection terminals CH[1] and CH[2] from the presence or absence of a resistance value abnormality between the connection terminals CH[2] and CH[3]. The error signal mentioned above can contain information indicating between which connection terminals a resistance value abnormality is present. In a case where between which connection terminals a resistance value abnormality is present is identified, the result of detecting the presence or absence of a resistance value abnormality can be stored in the above-mentioned register for each pair of adjacent connection terminals.

If in the initial detection process α a resistance value abnormality is judged to be present, the main control circuit 20 may inhibit an advance from Step S1 to Step S2 or an advance from Step S2 to Step S3. If in the regular detection process β a resistance value abnormality is judged to be present, the main control circuit 20 may suspend PWM driving. In a configuration where between which connection terminals a resistance value abnormality is present is identified, the main control circuit 20 may suspend PWM driving only for the channel where the resistance value abnormality is present.

Now, specific examples of configuration and operation, applied technologies, and the like in connection with the fault detection process or the light-emitting system SYS will be described by way of a plurality of practical examples. Unless otherwise stated or unless inconsistent, any features described in connection with the embodiment above are applicable to the practical examples described below. For any features of the practical examples that contradict with what has been described above, their description given in connection with the practical examples can prevail. Unless inconsistent, any feature of any of the plurality of practical examples described below is applicable to any other of the practical examples (i.e., two or more of the plurality of practical examples can be implemented in combination).

Practical Example EX1_A

Practical Example EX1_A will be described. Practical Example EX1_A deals with a configuration for carrying out the initial detection process α and how it operates.

Figure 6:
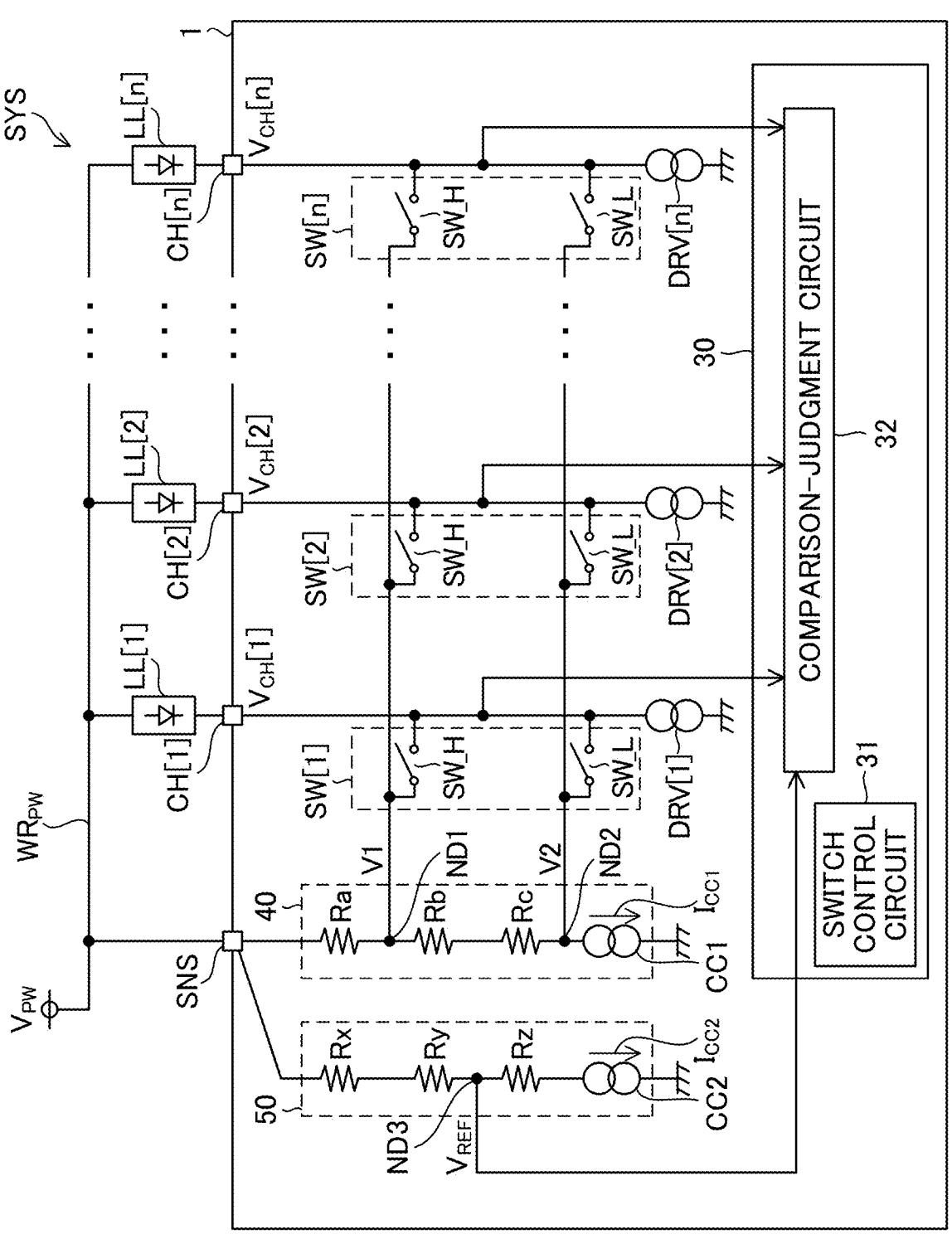
FIG. 6 is a diagram showing the internal and peripheral configuration of an LED driver according to Practical Example EX1_A belonging to the embodiment of the present disclosure.

FIG. 6 shows, out of the internal configuration of the LED driver 1, the part involved in the initial detection process α in particular. The LED driver 1 includes, in addition to the circuits already described above, an evaluation voltage generation circuit 40 and a reference voltage generation circuit 50. Note that, while FIG. 6 shows the current drivers DRV[1] to DRV[n], as mentioned above, during the execution period of the initial detection process α, the current drivers DRV[1] to DRV[n] all remain halted from driving. In the following description, the voltage at the connection terminal CH[i] is referred to as the terminal voltage $V_{CH}[i]$ (this applies also to any other practical example described later). Where no distinction is made among a plurality of terminal voltages, any of them can be referred to as the terminal voltage $V_{CH}$ (this applies also to any other practical example described later).

Based on the driving voltage $V_{PW}$ applied to the sense terminal SNS, the evaluation voltage generation circuit 40 produces a voltage V1 as a first evaluation voltage at a node ND1 and produces a voltage V2 as a second evaluation voltage at a node ND2. Specifically, the evaluation voltage generation circuit 40 includes resistors Ra, Rb, and Rc and a constant current circuit CC1. The first terminal of the resistor Ra is connected to the sense terminal SNS to receive the driving voltage $V_{PW}$. The second terminal of the resistor Ra is, together with the first terminal of the resistor Rb, connected to the node ND1. The second terminal of the resistor Rb is connected to the first terminal of the resistor Rc. The second terminal of the resistor Rc is connected to the node ND2. The constant current circuit CC1 is provided between the node ND2 and the ground, and operates so as to pass a constant current $I_{CC1}$ from the node ND2 to the ground. The voltage V1 is the voltage appearing at the node ND1, and the voltage V2 is the voltage appearing at the node ND2.

Based on the driving voltage $V_{PW}$ applied to the sense terminal SNS, the reference voltage generation circuit 50 generates a reference voltage $V_{REF}$. Specifically, the reference voltage generation circuit 50 includes resistors Rx, Ry, and Rz and a constant current source CC2. The first terminal of the resistor Rx is connected to the sense terminal SNS to receive the driving voltage $V_{PW}$. The second terminal of the resistor Rx is connected to the first terminal of the resistor Ry. The second terminal of the resistor Ry is, together with the first terminal of the resistor Rz, connected to a node ND3. The second terminal of the resistor Rz is connected to the constant current source CC2. The constant current source CC2 is provided between the second terminal of the resistor Rz and the ground, and operates so as to pass a constant current $I_{CC2}$ from the second terminal of the resistor Rz to the ground. The reference voltage $V_{REF}$ is the voltage appearing at the node ND3.

The LED driver 1 includes, for each channel, a switch circuit SW. The switch circuit SW corresponding to the ith channel (in other words, the switch circuit SW belonging to the ith channel) is referred to specifically as the switch circuit SW[i]. It can also be understood that the LED driver 1 includes a first to an nth channel circuit that are identically configured and that the ith channel circuit includes the connection terminal CH[i], the switch circuit SW[i], and the current driver DRV[i].

Each switch circuit SW includes a high-side switch SW_H and a low-side switch SW_L. The switches SW_H and SW_L can be configured with analog switches. The switches SW_H and SW_L each have a first terminal and a second terminal.

The first terminals of all the high-side switches in the switch circuits SW[1] to SW[n] are connected to the node ND1. The second terminal of the high-side switch SW_H in the switch circuit SW[i] is connected to the connection terminal CH[i]. Thus, for each channel, the high-side switch SW_H is inserted in series between the node ND1 and the connection terminal CH. In the ith channel, if the high-side switch SW_H in the switch circuit SW[i] is on, the node ND1 and the connection terminal CH[i] conduct to each other and, if the high-side switch SW_H in the switch circuit SW[i] is off, the node ND1 and the connection terminal CH[i] are cut off from each other.

The first terminals of all the low-side switches SW_L in the switch circuits SW[1] to SW[n] are connected to the node ND2. The second terminal of the low-side switch SW_L in the switch circuit SW[i] is connected to the connection terminal CH[i]. Thus, for each channel, the low-side switch SW_L is inserted in series between the node ND2 and the connection terminal CH. In the ith channel, if the low-side switch SW_L in the switch circuit SW[i] is on, the node ND2 and the connection terminal CH[i] conduct to each other and, if the low-side switch SW_L in the switch circuit SW[i] is off, the node ND2 and the connection terminal CH[i] are cut off from each other.

The fault detection circuit 30 includes a switch control circuit 31 and a comparison-judgment circuit 32. The switch control circuit 31 controls the on/off states of all the switches SW_H and SW_L in the switch circuits SW[1] to SW[n]. The comparison-judgment circuit 32 is connected to the connection terminals CH[1] to CH[n] and to the node ND3 to receive the terminal voltages $V_{CH}[1]$ to $V_{CH}[n]$ and the reference voltage $V_{REF}$. The comparison-judgment circuit 32 includes one or more comparators that compare one of the terminal voltages $V_{CH}[1]$ to $V_{CH}[n]$ with the reference voltage $V_{REF}$ and detects a resistance value abnormality (detects the presence or absence of a resistance value abnormality) based on the result of the comparison.

In the following description, the state where all the switches SW_H and SW_L in the switch circuits SW[1] to SW[n] are off is referred to, for convenience' sake, the all-switches-off state. The all-switches-off state corresponds to a state where the connection terminals CH[1] to CH[n] are cut off from the node ND1 and where the connection terminals CH[1] to CH[n] are cut off from the node ND2. It is here assumed that the on-resistance of the high-side switch SW_H when it is on is sufficiently low and that the on-resistance of the low-side switch SW_L when it is on is sufficiently low; in the following description, for simple description, it is assumed that the on-resistances of the switches SW_H and SW_L are zero. Note that the switch control circuit 31 never has the switches SW_H and SW_L in one switch circuit SW both on simultaneously; it can control the switches SW_H and SW_L such that only one of them is on at a time.

As will be understood from the circuit configuration in FIG. 6, the voltages V1 and V2 are lower than the driving voltage $V_{PW}$. The resistance values of the resistors Ra, Rb, and Rc are represented by the symbols "ra", "rb", and "rc" respectively. The voltage V1 in the all-switches-off state is referred to as the voltage $V1_{SET}$ and the voltage V2 in the all-switches-off state is referred to as the voltage $V2_{SET}$. Then the voltages $V1_{SET}$ and $V2_{SET}$ can be expressed as $V1_{SET}=V_{PW}-ra\cdot I_{CC1}$ and $V2_{SET}=V_{PW}-(ra+rb+rc)\cdot I_{CC1}$. Thus, in the all-switches-off state, the voltage V2 is lower than the voltage V1.

Moreover, in the all-switches-off state, $V1>V_{REF}>V2$ holds. That is, in the all-switches-off state, the reference voltage $V_{REF}$ is lower than the voltage V1 and higher than the voltage V2 (i.e., $V1_{SET}>V_{REF}>V2_{SET}$). For example, the resistance value ratio among the resistors Rx, Ry, and Rz can be set equal to the resistance value ratio among the resistors Ra, Rb, and Rc and in addition the value of the constant current $I_{CC2}$ can be set equal to the value of the constant current $I_{CC1}$. Then, in the all-switches-off state, $V1>V_{REF}>V2$ holds. However, in the all-switches-off state, so long as $V1>V_{REF}>V2$ holds, the resistance values of the resistors in the circuits 40 and 50 and the values of the constant currents $I_{CC1}$ and $I_{CC2}$ can be set as desired. The constant current circuit CC1 can be a variable current source that can vary the value of the constant current $I_{CC1}$ and the constant current circuit CC2 can be a variable current source that can vary the value of the constant current $I_{CC2}$.

Figure 7:
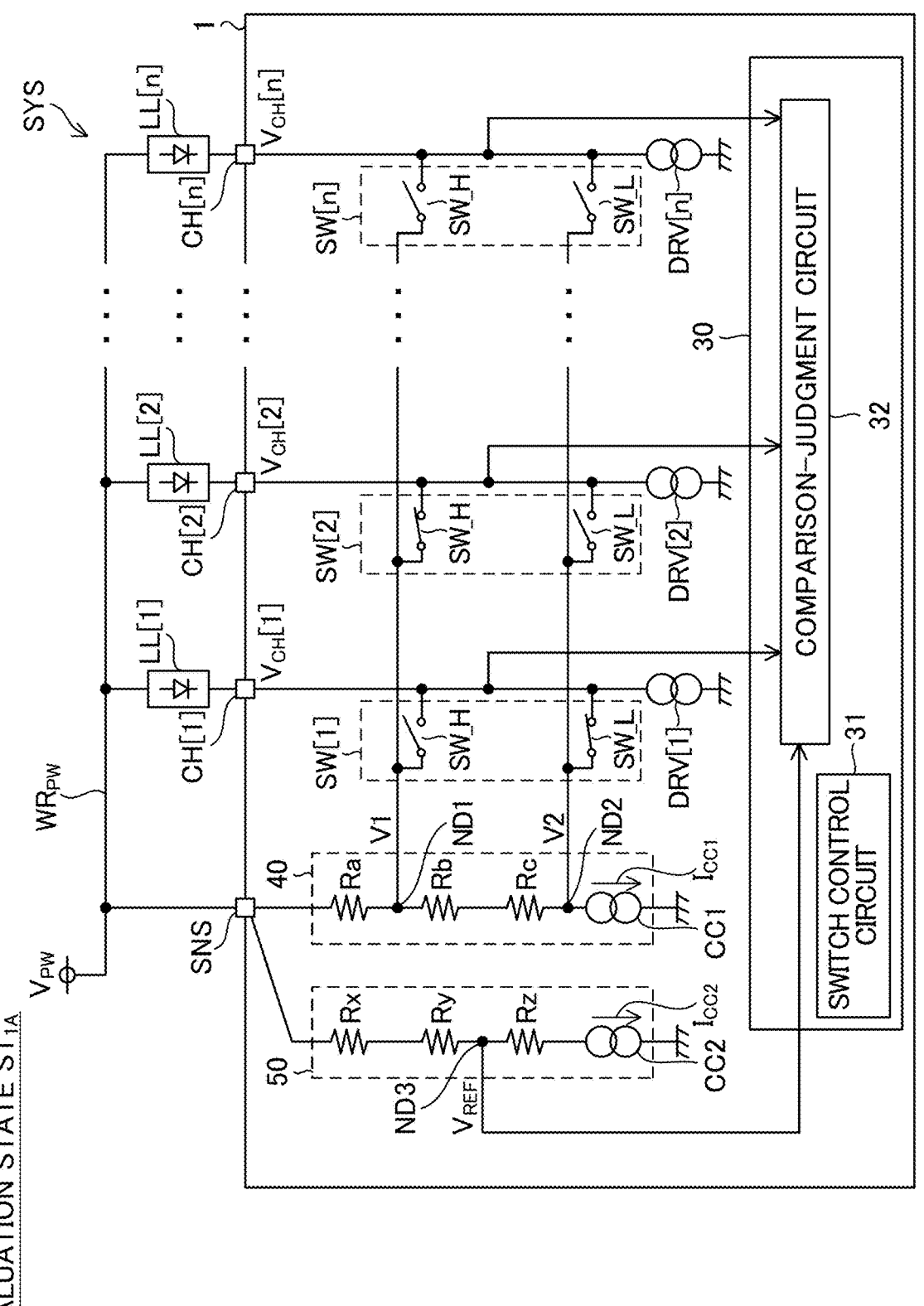
FIG. 7 is a diagram showing the state inside the LED driver during execution of an initial detection process according to Practical Example EX1_A belonging to the embodiment of the present disclosure.

Now, the initial detection process α will be described assuming that the connection terminals $CH_A$ and $CH_B$ in FIG. 5 are the connection terminals CH[1] and CH[2]. The connection terminals CH[1] and CH[2] are two external terminals that are adjacent to each other. In the initial detection process α, the switch control circuit 31 brings the switch circuits SW[1] to SW[n] into an evaluation state $ST_{1A}$ as shown in FIG. 7. In the evaluation state $ST_{1A}$, of all the switches SW_H and SW_L in the switch circuits SW[1] to SW[n], only the low-side switch SW_L in the switch circuit SW[1] and the high-side switch SW_H in the switch circuit SW[2] are on and the other switches are all off.

Figure 8:
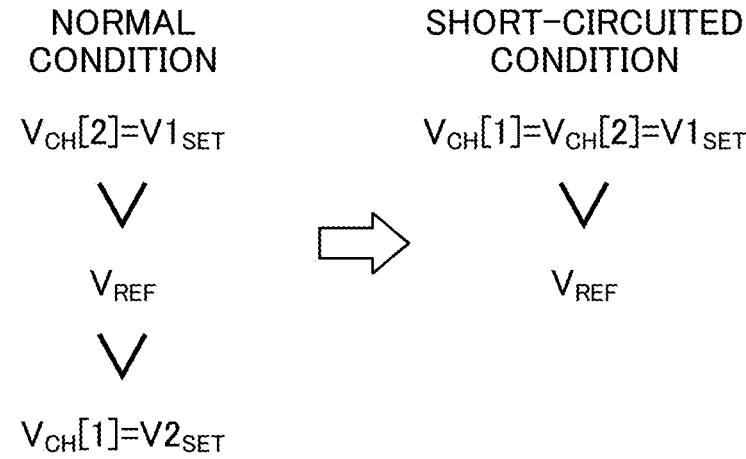
FIG. 8 is a diagram illustrating a method for resistance value abnormality detection in the initial detection process according to Practical Example EX1_A belonging to the embodiment of the present disclosure.

FIG. 8 shows the relationship among the voltages $V_{CH}[1]$, $V_{CH}[2]$, and $V_{REF}$ in the evaluation state $ST_{1A}$ in FIG. 7. Within the evaluation state $ST_{1A}$, in a normal condition where no resistance value abnormality is present between the connection terminals CH[1] and CH[2] and the dielectric resistance between the connection terminals CH[1] and CH[2] is sufficiently high, $V_{CH}[1]=V2_{SET}<V_{REF}<V_{CH}[2]=V1_{SET}$ holds. By contrast, within the evaluation state $ST_{1A}$, in a state where the connection terminals CH[1] and CH[2] are short-circuited together, the same potential is applied to the connection terminals CH[1] and CH[2], so that $V_{REF}<V_{CH}[1]=V_{CH}[2]=V1_{SET}$ (assuming that the resistance value across the short-circuited part is zero). In this state, the constant current $I_{CC1}$ passes from the sense terminal SNS via the resistor Ra, the high-side switch SW_H in the switch circuit SW[2], the connection terminals CH[2] and CH[1], and the low-side switch SW_L in the switch circuit SW[1] into the constant current circuit CC1.

In the evaluation state $ST_{1A}$ in FIG. 7, the comparison-judgment circuit 32 compares the terminal voltage $V_{CH}[1]$ with the reference voltage $V_{REF}$. If, in the evaluation state $ST_{1A}$, $V_{CH}[1]>V_{REF}$ holds, the comparison-judgment circuit 32 judges that a resistance value abnormality (e.g., short circuit) is present between the connection terminals CH[1] and CH[2]. If, in the evaluation state $ST_{1A}$, $V_{CH}[1]>V_{REF}$ does not hold, the comparison-judgment circuit 32 judges that no resistance value abnormality is present between the connection terminals CH[1] and CH[2].

Here, in the initial detection process α, a voltage is applied to the connection terminal CH and thus, depending on the value of the voltage, a current passes through the light-emitting unit LL, which hence emits light. However, since the initial detection process α is a process executed in the initial check operation (see FIG. 2) at Step S1, it is inappropriate, and often not allowed, to let the light-emitting unit LL emit light in the initial check operation. In this respect, in the LED driver 1, the driving voltage $V_{PW}$ applied to the high-potential terminal of the light-emitting unit LL is monitored at the sense terminal SNS, and the voltages (V1, V2) applied to the connection terminals CH in the initial detection process α are generated from the driving voltage $V_{PW}$. It is thus possible to keep the voltage applied to the light-emitting unit LL in the initial detection process α so low that the light-emitting unit LL does not emit light and thereby to prevent the light-emitting unit LL from emitting light for the resistance value abnormality detection process.

More specifically, in the all-switches-off state, the difference between the driving voltage $V_{PW}$ and the voltage V2, that is, the voltage difference $(V_{PW}-V2_{SET})$ is lower than the forward voltage $Vf_{REF}$ of each light-emitting unit LL that it requires to emit light. This helps reliably prevent the light-emitting unit LL from emitting light in the initial detection process α.

The forward voltage $Vf_{REF}$ here corresponds to the lower limit of the forward voltage across the light-emitting unit LL[i] that it requires to emit light. That is, the forward voltage $Vf_{REF}$ is the lower limit of the voltage that needs to be applied between the low-potential and high-potential terminals of the light-emitting unit LL[i] to make it emit light. Accordingly, if the potential at the high-potential terminal of the light-emitting unit LL[i] relative to the low-potential terminal of the light-emitting unit LL[i] is lower than the forward voltage $Vf_{REF}$, no significant forward current passes through the light-emitting unit LL[i], which hence does not emit light. It can be understood that the voltage applied between the low-potential and high-potential terminals of the light-emitting unit LL[i] when a forward current of a predetermined sufficiently small magnitude passes through the light-emitting unit LL[i] in a predetermined environment (e.g., in an environment where the ambient temperature of the LED driver 1 is 25° C.) corresponds to the forward voltage $Vf_{REF}$. It is here assumed that the forward voltage $Vf_{REF}$ is equal among the light-emitting units LL[1] to LL[n].

A switch can be provided between the high-potential terminal of each light-emitting unit LL and the wire $WR_{PW}$ so that, when the resistance value abnormality detection process is executed, the switch can be turned off. With this scheme, regardless of the voltage applied to the connection terminal CH, the light-emitting unit LL can be prevented from emitting light. Such a switch, however, is often not provided or cannot be provided. The scheme of this practical example, by contrast, functions effectively in a configuration where a switch is not provided between the high-potential terminal of each light-emitting unit LL and the wire $WR_{PW}$.

While the initial detection process α according to this practical example has been described with focus on two adjacent connection terminals CH[1] and CH[2], the initial detection process α according to this practical example can be carried out for every combination of two adjacent connection terminals CH. Specifically, for example, in a case where the connection terminals CH[3] and CH[4] are adjacent to each other at one side (SD1, SD2, SD3, SD4) of the LED driver 1, the initial detection process α according to this practical example can be carried out also for the combination of the connection terminals CH[3] and CH[4].

For another example, in a case where the connection terminals CH[1], CH[2], and CH[3] are adjacent to each other at one side (SD1, SD2, SD3, SD4) of the LED driver 1, the initial detection process α according to this practical example can be carried out for each of the combination of the adjacent connection terminals CH[1] and CH[2] and the combination of the adjacent connection terminals CH[2] and CH[3].

Practical Example EX1_B

Practical Example EX1_B will be described. Practical Example EX1_B deals with an initial detection process α that can be executed suitably for four or more connection terminals CH arranged in a row along a predetermined direction. In Practical Example EX1_B, the configuration of the LED driver 1 itself is the same as described in connection with Practical Example EX1_A.

Figure 9:
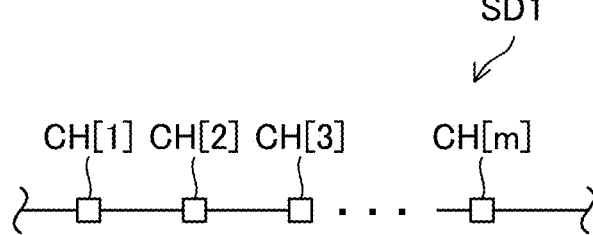
FIG. 9 is a diagram showing an assumed terminal array according to Practical Example EX1_B belonging to the embodiment of the present disclosure.

For specific description, it is here assumed that the connection terminals CH[1] to CH[m] are arranged in a terminal array AR as shown in FIG. 9. The connection terminals CH[1] to CH[m] are some or all of the connection terminals CH[1] to CH[n] provided on the LED driver 1. The symbol m represents any integer of four or more. In the terminal array AR, the connection terminals CH[1] to CH[m] are provided at the side SD1 of the LED driver 1 and are arranged in a row along the direction of the side SD1. Here, it is assumed that, for any integer i that fulfills 1≤i≤m−1, the connection terminals CH[i] to CH[i+1] are adjacent to each other with no other connection terminal arranged between the connection terminals CH[i] to CH[i+1]. That is, in the terminal array AR, along the direction of the side SD1, there are arranged connection terminals CH[1], CH[2], CH[3], . . . and CH[m] in this order. Accordingly, if m=8, in the terminal array AR, along the direction of the side SD1, there are arranged the connection terminals CH[1], CH[2], CH[3], CH[4], CH[5], CH[6], CH[7], and CH[8] in this order.

In the following description, for any switch circuit SW, the state where the high-side switch SW_H is on and the low-side switch SW_L is off is referred to as the high-side on state and the state where the high-side switch SW_H is off and the low-side switch SW_L is on is referred to as the low-side on state. Accordingly, for example, in the evaluation state $ST_{1A}$ in FIG. 7, the switch circuit SW[1] is in the low-side on state and the switch circuit SW[2] is in the high-side on state.

Figure 10:
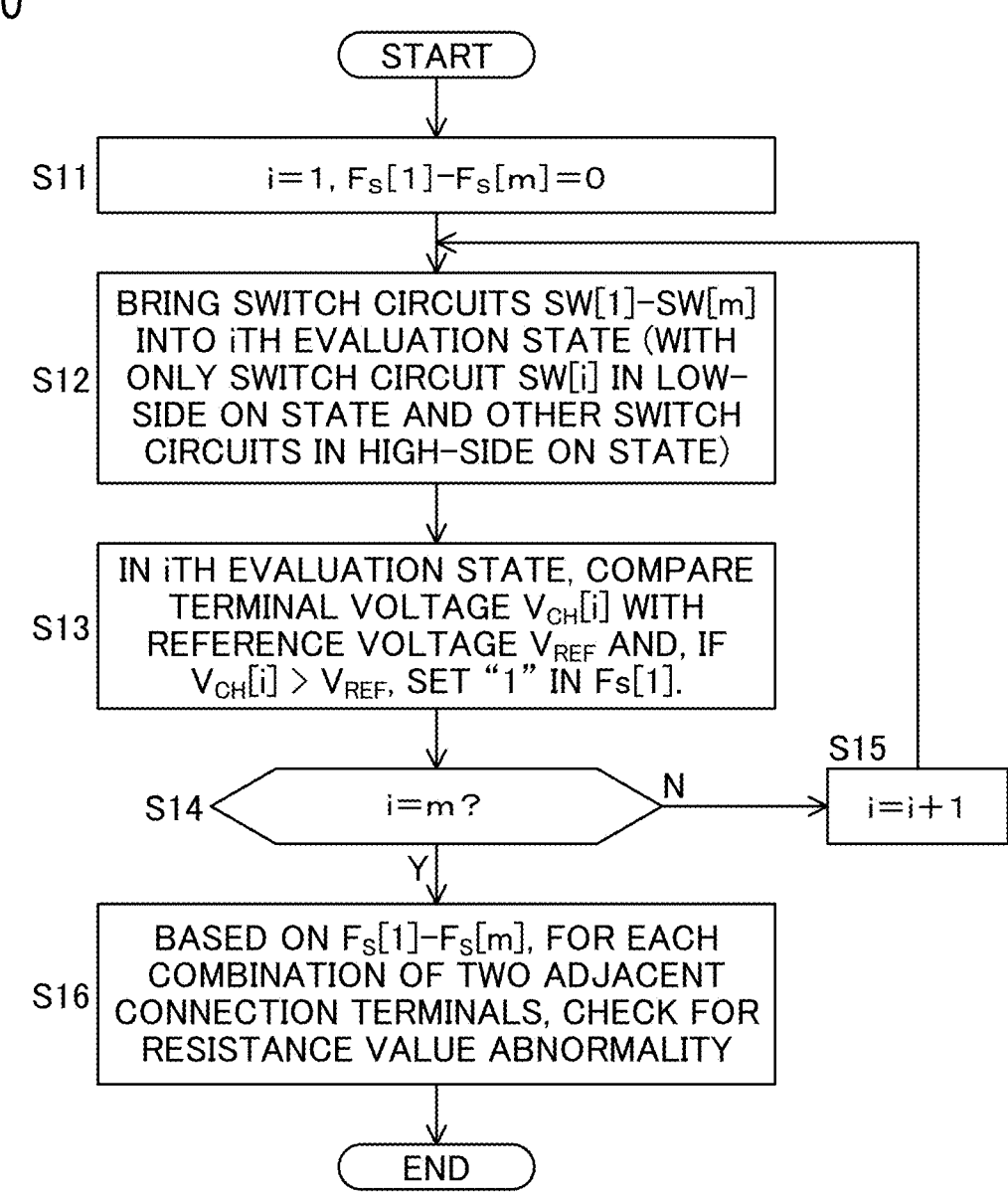
FIG. 10 is an operation flow chart of the initial detection process according to Practical Example EX1_B belonging to the embodiment of the present disclosure.

FIG. 10 is an operation flow chart of the initial detection process α according to Practical Example EX1_B. Note that the integer i and the judgement flags $F_S[1]$ to $F_S[m]$ referred to in the flow chart in FIG. 10 are a variable and flags that are managed and updated by the switch control circuit 31. Now, along the flow chart in FIG. 10, the flow of the initial detection process α according to Practical Example EX1_B will be described.

In the initial detection process α according to Practical Example EX1_B, first, at Step S11, "1" is substituted in the variable i and an initial value "0" is set in each of the judgement flags $F_S[1]$ to $F_S[m]$. An advance is then made to Step S12.

At Step S12, the switch control circuit 31 brings the switch circuits SW[1] to SW[m] into an ith evaluation state. In the ith evaluation state, of the switch circuits SW[1] to SW[m], only the switch circuit SW[i] is in the low-side on state and the other switch circuits SW are all in the high-side on state. As one example FIG. 11 shows a first to a fourth evaluation state with m=4. Step S12 is followed by Step S13.

At Step S13, the comparison-judgment circuit 32 compares the terminal voltage $V_{CH}[i]$ in the ith evaluation state with the reference voltage $V_{REF}$. If the terminal voltage $V_{CH}[i]$ in the ith evaluation state is higher than the reference voltage $V_{REF}$, the comparison-judgment circuit 32 sets "1" in the judgment flag $F_S[i]$; otherwise, the comparison-judgment circuit 32 keeps the value of the judgment flag $F_S[i]$ at "0". Step S13 is followed by Step S14.

At Step S14, whether i=m holds is checked. If i=m does not hold (Step S14, "N"), an advance is made from Step S14 to Step S15. At Step S15, "1" is added to the variable i, and then a return is made to Step S12, where Step S12 and the subsequent steps are repeated. If i=m holds (Step S14, "Y"), an advance is made from Step S14 to Step S16. When Step S16 is reached, for each of the first to mth evaluation states, the results of comparison of the terminal voltage $V_{CH}$ with the reference voltage $V_{REF}$ have been reflected in the judgment flags.

At Step S16, based on the judgment flags $F_S[1]$ to $F_S[m]$, the comparison-judgment circuit 32 checks for the presence or absence of a resistance value abnormality for each of the combinations of two adjacent connection terminals CH among the connection terminals CH[1] to CH[m].

In the ith evaluation state, if no resistance value abnormality is present between the connection terminal CH[i] and a connection terminal adjacent to the connection terminal CH[i], $V_{CH}[i]<V_{REF}$ holds. A connection terminal adjacent to the connection terminal CH[i] is the connection terminal CH[i−1] or CH[i+1]. By contrast, in the ith evaluation state, if a resistance value abnormality is present between the connection terminal CH[i] and a connection terminal adjacent to the connection terminal CH[i], $V_{CH}[i]>V_{REF}$ holds and "1" is set in the judgment flag $F_S[i]$ (Step S13). Thus, if "1" is set in the judgment flag $F_S[i]$, the comparison-judgment circuit 32 can judge that a resistance value abnormality (e.g., short circuit) is present between the connection terminal CH[i] and a connection terminal adjacent to the connection terminal CH[i].

If, for the sake of discussion, a resistance value abnormality (e.g., short circuit) is present between the connection terminals CH[1] and CH[2], then, in the first evaluation state, $V_{CH}[1]>V_{REF}$ holds and "1" is set in the judgment flag $F_S[1]$ (S13, first time) and, in the second evaluation state, $V_{CH}[2]>V_{REF}$ holds and "1" is set in the judgment flag $F_S[2]$ (Step S13, second time). Thus, if "1" is set in both the judgment flags $F_S[1]$ and $F_S[2]$, the comparison-judgment circuit 32 can judge that a resistance value abnormality (e.g., short circuit) is present between the connection terminals CH[1] and CH[2]. Likewise, if, for the sake of discussion, a resistance value abnormality (e.g., short circuit) is present between the connection terminals CH[2] and CH[3], then, in the second evaluation state, $V_{CH}[2]>V_{REF}$ holds and "1" is set in the judgment flag $F_S[2]$ (S13, second time) and, in the third evaluation state, $V_{CH}[3]>V_{REF}$ holds and "1" is set in the judgment flag $F_S[3]$ (Step S13, third time). Thus, if "1" is set in both the judgment flags $F_S[2]$ and $F_S[3]$, the comparison-judgment circuit 32 can judge that a resistance value abnormality (e.g., short circuit) is present between the connection terminals CH[2] and CH[3].

A similar description applies to any other combination of connection terminals.

As described above, in the initial detection process α, the fault detection circuit 30 (comparison-judgment circuit 32) according to Practical Example EX1_B can detect, based on the terminal voltage $V_{CH}[1]$ in the first evaluation state, the terminal voltage $V_{CH}[2]$ in the second evaluation state, . . . and the terminal voltage $V_{CH}[m]$ in the mth evaluation state, a resistance value abnormality between the connection terminals CH[1] and CH[2], a resistance value abnormality between the connection terminals CH[2] and CH[3], . . . and a resistance value abnormality between the connection terminals CH[m−1] and CH[m] while distinguishing among these. Identifying the location of a resistance value abnormality facilitates the subsequent course of action such as maintenance, repair, or a review of the production procedure.

Specifically, in the initial detection process α, the fault detection circuit 30 (comparison-judgment circuit 32) according to Practical Example EX1_B can compare each of the terminal voltage $V_{CH}[1]$ in the first evaluation state, the terminal voltage $V_{CH}[2]$ in the second evaluation state, . . . and the terminal voltage $V_{CH}[m]$ in the mth evaluation state with the reference voltage $V_{REF}$ and thereby detect a resistance value abnormality between the connection terminals CH[1] and CH[2], a resistance value abnormality between the connection terminals CH[2] and CH[3], . . . and a resistance value abnormality between the connection terminals CH[m−1] and CH[m] while distinguishing among these.

Specifically, if the terminal voltage $V_{CH}[j]$ in the jth evaluation state is higher than the reference voltage $V_{REF}$ and in addition the terminal voltage $V_{CH}[j+1]$ in the (j+1)th evaluation state is higher than the reference voltage $V_{REF}$, the fault detection circuit 30 (comparison-judgment circuit 32) according to Practical Example EX1_B can judge that a resistance value abnormality is present between the connection terminals CH[j] and CH[j+1]. Here, j represents a natural number equal to or less than (m−1).

At Step S16, if the values of the judgment flags $F_S[1]$ to $F_S[m]$ are all "0", the comparison-judgment circuit 32 judges that no resistance value abnormality is present among the connection terminals CH[1] to CH[m] (no resistance value abnormality is present at all).

In the ith evaluation state, all the switches in the switch circuits corresponding to those connection terminals that are not adjacent to the connection terminal CH[i] can be left off. That is, in the first evaluation state, all the switches in the switch circuits SW[3] to SW[m] can be left off and, in the second evaluation state, all the switches in the switch circuits SW[4] to SW[m] can be left off. Assuming that m≥5, in the third evaluation state, all the switches in the switch circuits SW[1] and SW[5] to SW[m] can be left off. A similar description applies to any other evaluation state. For example, if m=4, as shown in FIG. 12, in the first evaluation state, all the switches in the switch circuits SW[3] and SW[4] can be left off; in the second evaluation state, all the switches in the switch circuits SW[4] can be left off; in the third evaluation state, all the switches in the switch circuits SW[1] can be left off; and in the fourth evaluation state, all the switches in the switch circuits SW[1] and SW[2] can be left off.

Practical Example EX1_C

Practical Example EX1_C will be described. In the terminal array AR shown in FIG. 9, the initial detection process α can be executed as described below. For specific description, assuming that m=8 for the terminal array AR, the initial detection process α according to Practical Example EX1_C will be described.

In the initial detection process α, the switch control circuit 31 according to Practical Example EX1_C brings the switch circuits SW[1] to SW[8] into an evaluation state $ST_{1C}$ as shown in FIG. 13. In the evaluation state $ST_{1C}$, the switch circuits SW[1], SW[3], SW[5], and SW[7] are in the low-side on state and the switch circuits SW[2], SW[4], SW[6], and SW[8] are in the high-side on state.

For example, if the connection terminals CH[3] and CH[4] are short-circuited together, in the evaluation state $ST_{1C}$, the terminal voltage $V_{CH}[3]$ has the same potential as the terminal voltage $V_{CH}[4]$ and is higher than the reference voltage $V_{REF}$; accordingly, also the voltages (i.e., terminal voltage $V_{CH}[1]$, $V_{CH}[5]$, and $V_{CH}[7]$) at all the connection terminals CH connected via the low-side switch SW_L to the node ND2 are higher than the reference voltage $V_{REF}$. Thus, in the evaluation state $ST_{1C}$, the comparison-judgment circuit 32 has only to compare the terminal voltage $V_{CH}$ of one channel in which the corresponding switch circuit SW is in the low-side on state with the reference voltage $V_{REF}$. That is, in the evaluation state $ST_{1C}$, the comparison-judgment circuit 32 handles one of the terminal voltages $V_{CH}[1]$, $V_{CH}[3]$, $V_{CH}[5]$, and $V_{CH}[7]$ as a comparison-target voltage and compares the comparison-target voltage with the reference voltage $V_{REF}$. Then if the comparison-target voltage is higher than the reference voltage $V_{REF}$, the comparison-judgment circuit 32 judges that a resistance value abnormality is present at one of the connection terminals CH[1] to CH[8]. If the comparison-target voltage is lower than the reference voltage $V_{REF}$, the comparison-judgment circuit 32 judges that no resistance value abnormality is present at any of the connection terminals CH[1] to CH[8] (no resistance value abnormality is present at all).

With the initial detection process α according to Practical Example EX1_C, it is not possible to identify the location of a resistance value abnormality but it is possible to detect the presence or absence of a resistance value abnormality with a simple circuit and in a short time.

Practical Example EX2_A

Practical Example EX2_A will be described. Practical Example EX2_A deals with a configuration for carrying out the regular detection process β and how it operates. As mentioned above, the regular detection process β is a process executed during the period in which the regular light emission operation is performed (i.e., a process executed at Step S3 in FIG. 2).

Figure 14:
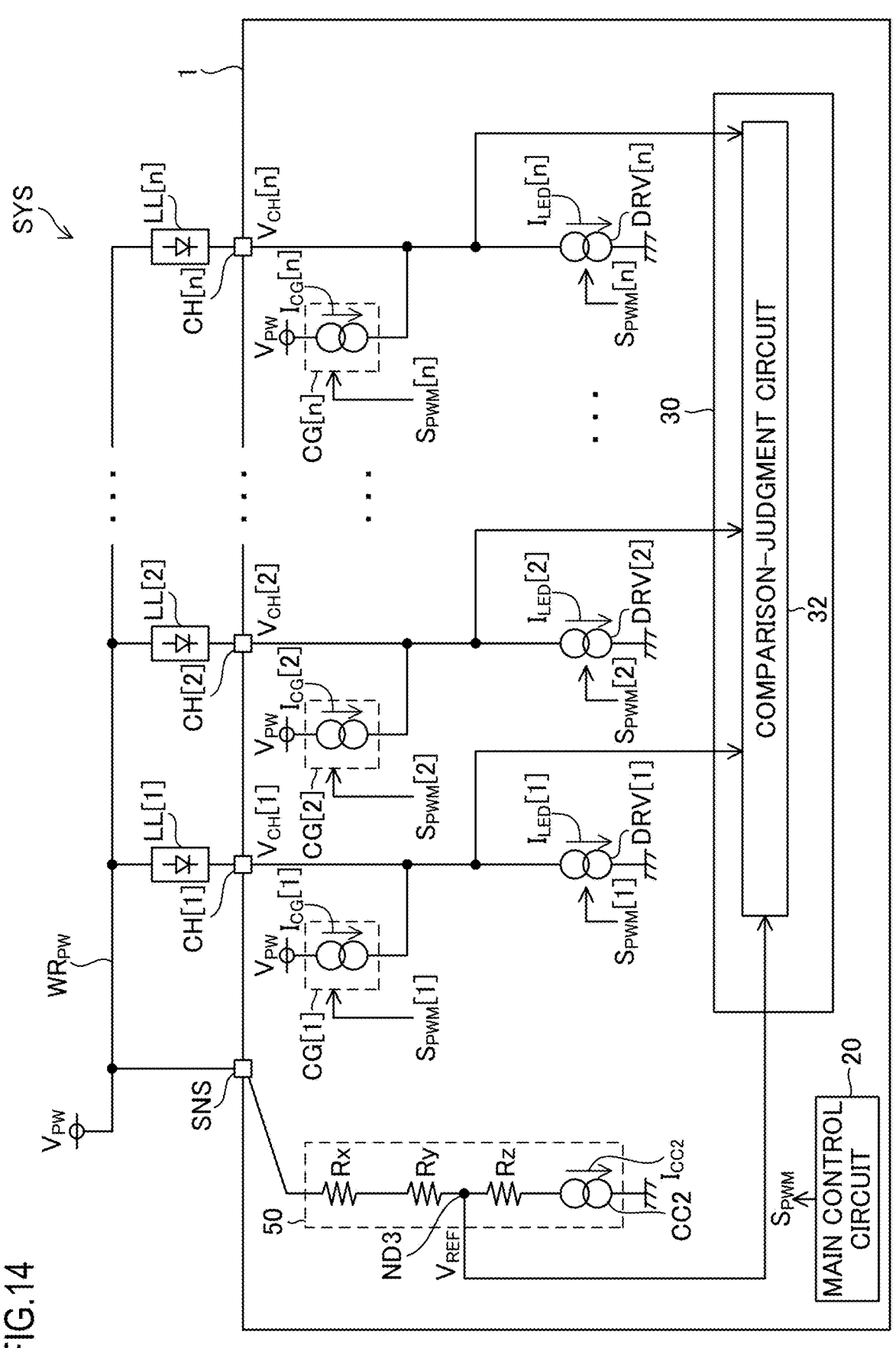
FIG. 14 is a diagram showing the internal and peripheral configuration of an LED driver according to Practical Example EX2_A belonging to the embodiment of the present disclosure.

FIG. 14 shows, out of the internal configuration of the LED driver 1, the part involved in the regular detection process β in particular. The LED driver 1 includes, in addition to the circuits already described, a charge circuit CG for each channel. The charge circuit CG corresponding to the ith channel (in other words, the charge circuit CG belonging to the ith channel) is referred to specifically as the charge circuit CG[i]. It can also be understood that the LED driver 1 includes a first to an nth channel circuit that are identically configured and that the ith channel circuit includes the connection terminal CH[i], the charge circuit CG[i], and the current driver DRV[i].

In the LED driver 1 in FIG. 14, the reference voltage generation circuit 50 is configured and operates as described above in connection with Practical Example EX1_A. Here, however, the constant current $I_{CC2}$ is given different values between when the initial detection process α is performed and when the regular detection process β is performed so that the reference voltage $V_{REF}$ have different values between when the initial detection process α is performed and when the regular detection process β is performed.

The comparison-judgment circuit 32 provided in the fault detection circuit 30 operates helpfully both when the initial detection process α is performed and when the regular detection process β is performed. The comparison-judgment circuit 32 is connected to the node ND3 and also to the connection terminals CH[1] to CH[n]. The comparison-judgment circuit 32 is fed with the reference voltage $V_{REF}$ at the node ND3 and the terminal voltages $V_{CH}[1]$ to $V_{CH}[n]$ at the connection terminals CH[1] to CH[n].

Note that, in the regular detection process β, the switch circuits SW[1] to SW[n] (see FIG. 6) are not used. Though not shown in FIG. 14 for simple illustration, the switch control circuit 31 (see FIG. 6) keeps the switch circuits SW[1] to SW[n] in the all-switches-off state during the period in which the regular light emission operation is performed (i.e., in the period in which the regular detection process β is executed). The switch control circuit 31 can, after the completion of the initial detection process α, switch the switch circuits SW[1] to SW[n] into the all-switches-off state. After the completion of the initial detection process α, the constant current circuit CC1 (see FIG. 6) can be suspended from its operation.

In the regular light emission operation, the main control circuit 20 supplies, for each channel, a signal $S_{PWM}$ to the current driver DRV to drive it by PWM. The signal $S_{PWM}$ is a pulse-width-modulation signal (PWM signal) that has a fixed frequency and that takes as its signal level high and low levels alternately. The signal $S_{PWM}$ supplied to the current driver DRV[i] is referred to specifically as the signal $S_{PWM}[i]$. The signals $S_{PWM}[1]$ to $S_{PWM}[n]$ have the same frequency.

The charge circuit CG[i] includes a constant current circuit provided between a terminal fed with the driving voltage $V_{PW}$ and the connection terminal CH[i]. The signal $S_{PWM}[i]$ is fed also to the charge circuit CG[i]. According to the signal $S_{PWM}[i]$, the charge circuit CG[i] can supply a charge current $I_{CG}[i]$ of a predetermined magnitude from the terminal fed with the driving voltage $V_{PW}$ to the connection terminal CH[i].

Figure 15:
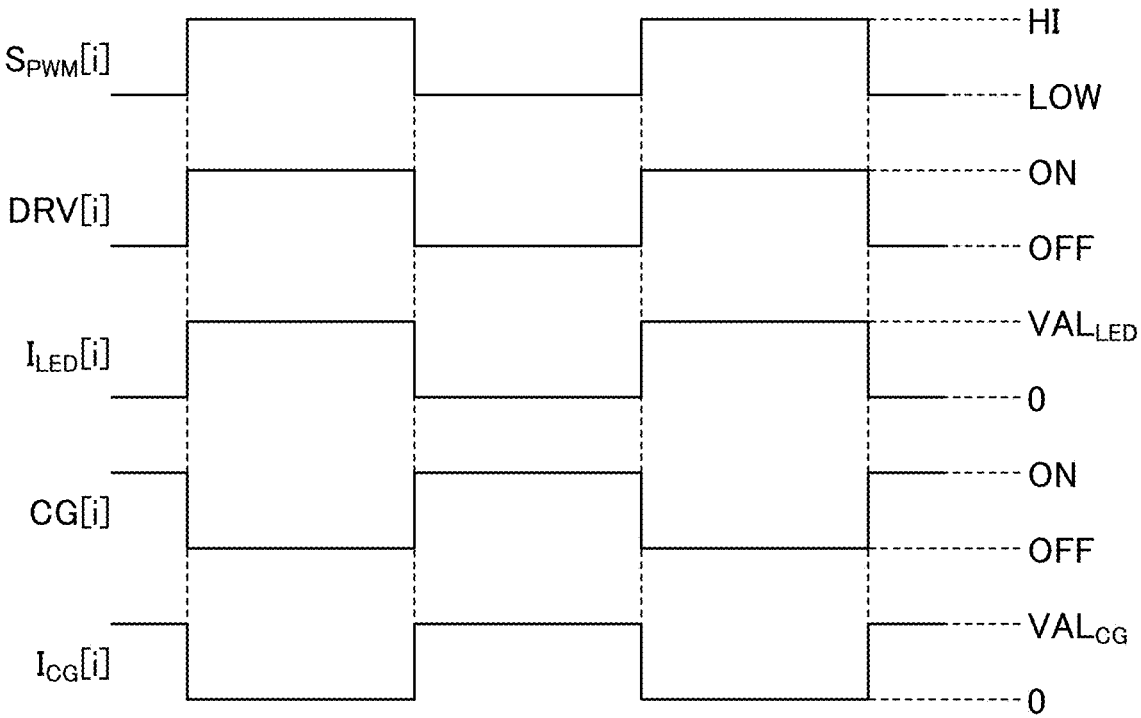
FIG. 15 is a diagram showing the relationship of a PWM signal with the operation of a current driver and a charge circuit according to Practical Example EX2_A belonging to the embodiment of the present disclosure.

FIG. 15 shows, with respect to one given channel, the relationship of the signal $S_{PWM}[i]$ with the operation of the current driver DRV[i] and the charge circuit CG[i]. Assuming that no resistance value abnormality is present among the connection terminals CH[1] to CH[n] at all, the relationship of the signal $S_{PWM}[i]$ with the operation of the current driver DRV[i] and the charge circuit CG[i] will be described. In the high-level period of the signal $S_{PWM}[i]$, the current driver DRV[i] operates to supply a driving current $I_{LED}[i]$ with a set current value $VAL_{LED}$ to the light-emitting unit LL[i]. That is, in the high-level period of the signal $S_{PWM}[i]$, a driving current $I_{LED}[i]$ with a set current value $VAL_{LED}$ is drawn from the wire $WR_{PW}$ via the connection terminal CH[i] into the current driver DRV[i] and thus the driving current $I_{LED}[i]$ with the set current value $VAL_{LED}$ passes through the light-emitting unit LL[i]. The set current value $VAL_{LED}$ is a positive value determined based on the value of the current setting resistor $R_{ISET}$ (see FIG. 1) and a command from the MPU 2. In the low-level period of the signal $S_{PWM}[i]$, the current driver DRV[i] remains halted and thus no current passes through the light-emitting unit LL[i].

As described above, in each channel, in response to the signal $S_{PWM}[i]$, the current driver DRV[i] supplies the light-emitting unit LL[i] with the driving current $I_{LED}[i]$ when the signal $S_{PWM}[i]$ has high level and suspends supplying the light-emitting unit LL[i] with the driving current $I_{LED}[i]$ when the signal $S_{PWM}[i]$ has low level.

The main control circuit 20 can, by adjusting the length of the high-level period of the signal $S_{PWM}[i]$ in each period of it, adjust the light emission luminance (average luminance) of the light-emitting unit LL[i]. In this way, in the regular light emission operation, each light-emitting unit LL is supplied with a pulse-width-modulated current as the driving current $I_{LED}$.

On the other hand, the charge circuit CG[i] operates in the low-level period of the signal $S_{PWM}[i]$ to supply a charge current $I_{CG}[i]$ with a predetermined current value $VAL_{CG}$ from the terminal fed with the driving voltage $V_{PW}$ to the connection terminal CH[i]. The predetermined current value $VAL_{CG}$ is a positive value sufficiently smaller than the set current value $VAL_{LED}$.

The charge current $I_{CG}[i]$ is a constant current generated in a constant current circuit within the charge circuit CG[i], and the constant current circuit within the charge circuit CG[i] generates the charge current $I_{CG}[i]$ based on the driving voltage $V_{PW}$. Thus, in the low-level period of the signal $S_{PWM}[i]$, until the terminal voltage $V_{CH}[i]$ reaches the driving voltage $V_{PW}$, the charge circuit CG[i] supplies the charge current $I_{CG}[i]$ with the predetermined current value $VAL_{CG}$ from the terminal fed with the driving voltage $V_{PW}$ to the connection terminal CH[i]. However, when the terminal voltage $V_{CH}[i]$ rises until it reaches the driving voltage $V_{PW}$, even if the signal $S_{PWM}[i]$ is at low level, the charge current $I_{CG}[i]$ has a zero value and no more positive electric charge is supplied from the charge circuit CG[i] to the connection terminal CH[i]. That is, the operation of the charge circuit CG[i] will not result in the terminal voltage $V_{CH}[i]$ rising above the driving voltage $V_{PW}$.

In FIG. 15, for conceptual illustration of the operation of the charge circuit CG[i], the charge current $I_{CG}[i]$ is shown as if its value remains equal to the predetermined current value $VAL_{GC}$ during the low-level period of the signal $S_{PWM}[i]$. In reality, while the charge current $I_{CG}[i]$ has the predetermined current value $VAL_{CG}$ immediately after the start of the low-level period of the signal $S_{PWM}[i]$, when the terminal voltage $V_{CH}[i]$ reaches the driving voltage $V_{PW}$, even if the signal $S_{PWM}[i]$ is at low level, the charge current $I_{CG}[i]$ has a zero value. Moreover, when the terminal voltage $V_{CH}[i]$ reaches a voltage slightly lower than the driving voltage $V_{PW}$, the charge circuit CG[i] may suspend supplying positive electric charge to the connection terminal CH[i]. In the following description, however, on the assumption that no resistance value abnormality is present, the charge circuit CG[i] is assumed to have a capacity to raise the terminal voltage $V_{CH}[i]$ up to the driving voltage $V_{PW}$ during the low-level period of the signal $S_{PWM}[i]$.

In the high-level period of the signal $S_{PWM}[i]$, the charge circuit CG[i] remains halted. That is, in the high-level period of the signal $S_{PWM}[i]$, regardless of the terminal voltage $V_{CH}[i]$, the charge circuit CG[i] suspends supplying the charge current $I_{CG}[i]$ (that is, no current passes between charge circuit CG[i] and the connection terminal CH[i]).

Figure 16:
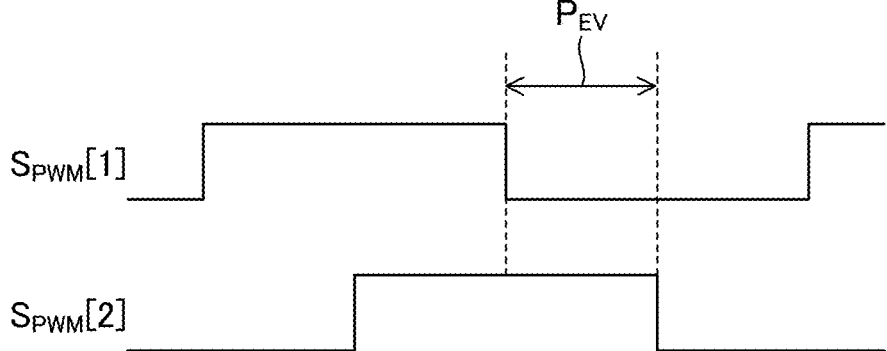
FIG. 16 is a diagram showing the relationship of two PWM signals with an evaluation period according to Practical Example EX2_A belonging to the embodiment of the present disclosure.

Now, the regular detection process β will be described assuming that the connection terminals $CH_A$ and $CH_B$ in FIG. 5 are the connection terminals CH[1] and CH[2]. The connection terminals CH[1] and CH[2] are two external terminals that are adjacent to each other. FIG. 16 shows the waveforms of the signals $S_{PWM}[1]$ and $S_{PWM}[2]$. In the regular light emission operation, the main control circuit 20 produces a period in which the low-level period of the signal $S_{PWM}[1]$ and the high-level period of the signal $S_{PWM}[2]$ overlap and a period in which the high-level period of the signal $S_{PWM}[1]$ and the low-level period of the signal $S_{PWM}[2]$ overlap. The main control circuit 20 can produce those periods by shifting the phases of the signals $S_{PWM}[1]$ and $S_{PWM}[2]$.

Here, the period in which the low-level period of the signal $S_{PWM}[1]$ and the high-level period of the signal $S_{PWM}[2]$ overlap will be given focus as the evaluation period $P_{EV}$. While the evaluation period $P_{EV}$ occurs every period of the signal $S_{PWM}$, the following description focuses on one evaluation period $P_{EV}$.

Figure 17:
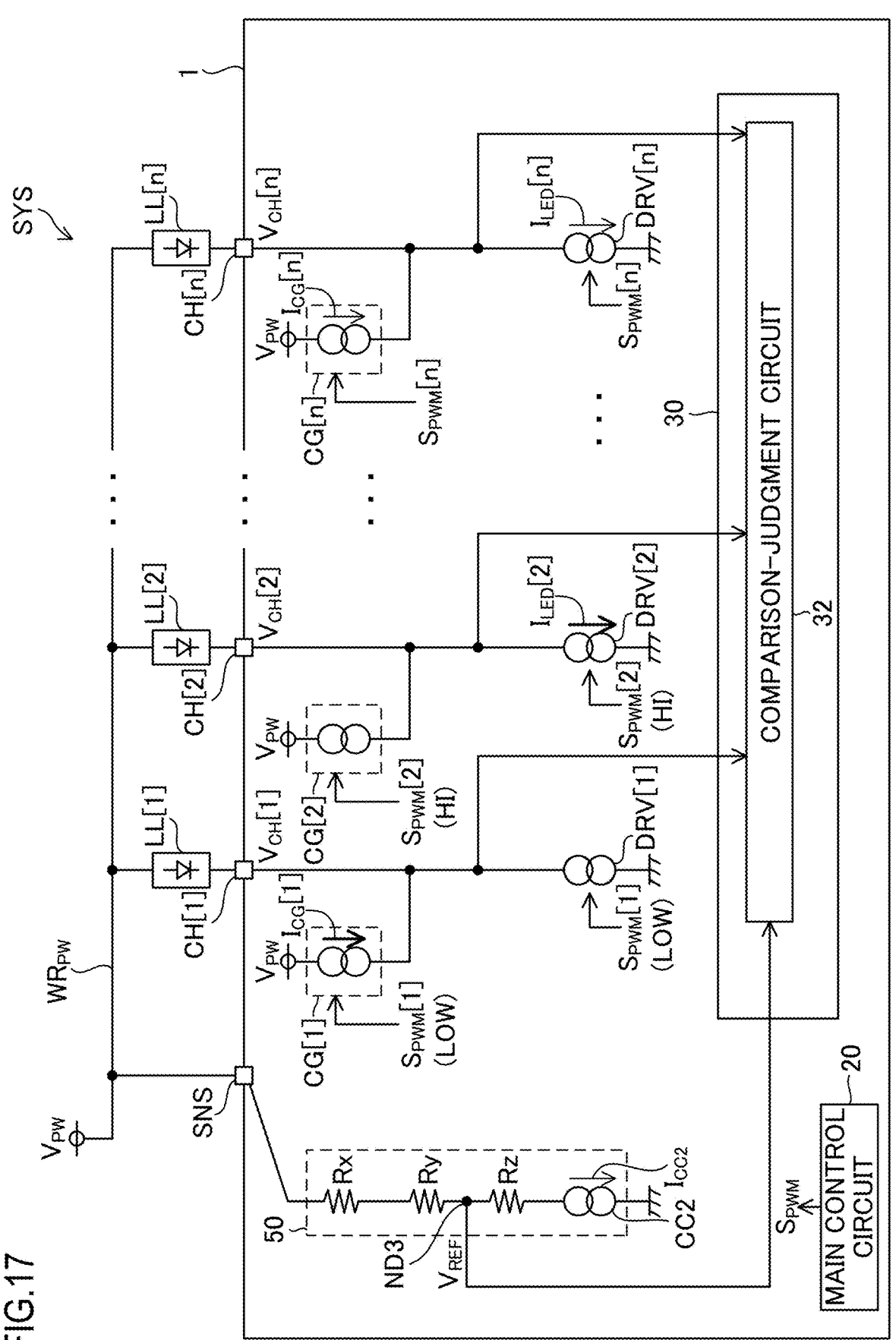
FIG. 17 is a diagram showing the state inside the LED driver during execution of a regular detection process according to Practical Example EX2_A belonging to the embodiment of the present disclosure.

FIG. 17 shows the operation in the first and second channels in the evaluation period $P_{EV}$. In the evaluation period $P_{EV}$, the signal $S_{PWM}[1]$ has low level; thus, the current driver DRV[1] suspends supplying the light-emitting unit LL[1] with the driving current $I_{LED}[1]$ and, on the other hand, the charge circuit CG[1] supplies the connection terminal CH[1] with the charge current $I_{CG}[1]$. In the evaluation period $P_{EV}$, the signal $S_{PWM}[2]$ has high level; thus, the current driver DRV[2] supplies the light-emitting unit LL[2] with the driving current $I_{LED}[2]$ and, on the other hand, the charge circuit CG[2] suspends supplying connection terminals CH[2] with the charge current $I_{CG}[2]$.

Figure 18:
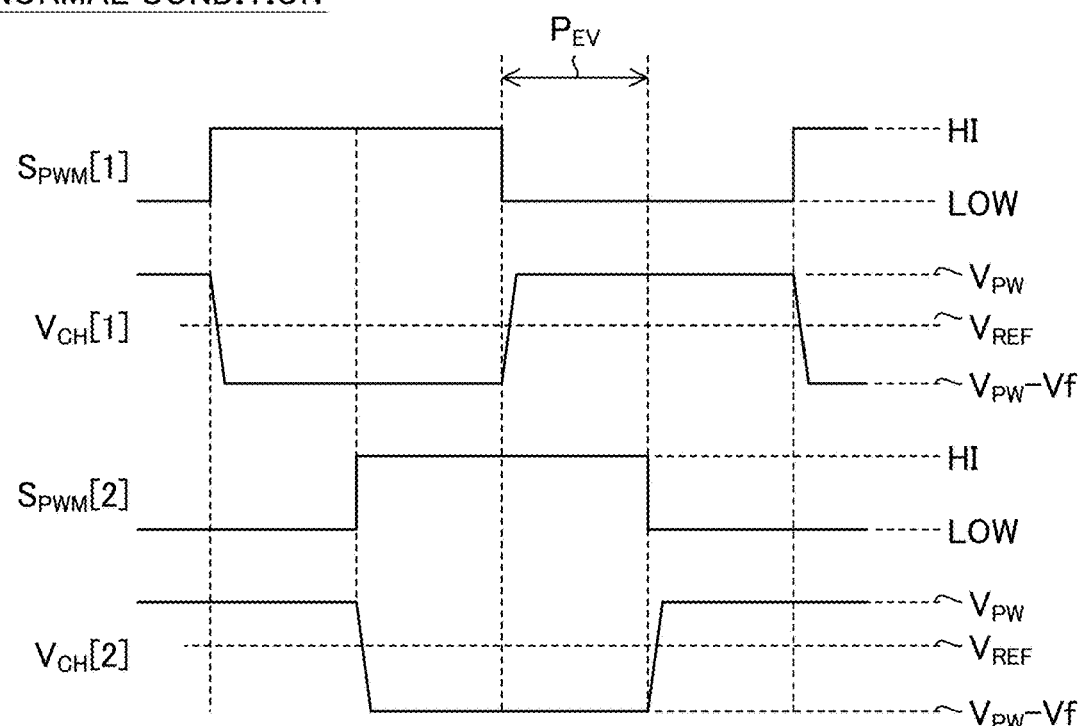
FIG. 18 is a diagram showing the relationship between PWM signals and terminal voltages in two channels in a normal condition according to Practical Example EX2_A belonging to the embodiment of the present disclosure.

First, consider a normal condition where no resistance value abnormality is present at the connection terminals CH[1] and CH[2] and the dielectric resistance between connection terminals CH[1] and CH[2] is sufficiently high. FIG. 18 shows the waveforms of the signal $S_{PWM}$ and the terminal voltage $V_{CH}$ in the first and second channels in the normal condition. In the high-level period of the signal $S_{PWM}[1]$, the terminal voltage $V_{CH}[1]$ is lower than the driving voltage $V_{PW}$ by the forward voltage Vf across the light-emitting unit LL[1]. A similar description applies to any other channel including the second channel. Note that the forward voltage Vf here is different from the forward voltage $Vf_{REF}$ mentioned in connection with Practical Example EX1_A, and refers to the forward voltage that appears, when an driving current $I_{LED}$ with the set current value $VAL_{LED}$ is passing through a given light-emitting unit LL, across that light-emitting unit LL (i.e., the voltage at the high-potential terminal of the light-emitting unit LL relative to the potential at its low-potential terminal). FIG. 18 also shows the level of the reference voltage $V_{REF}$. Here, $V_{PW}$>$V_{REF}$>$V_{PW}$–Vf holds. That is, the difference between the driving voltage $V_{PW}$ and the reference voltage $V_{REF}$ is smaller than the voltage Vf.

In the normal condition, when a down edge appears in the signal $S_{PWM}$[1] and the evaluation period $P_{EV}$ starts, the charge current $I_{CG}$[1] is output so that the terminal voltage $V_{CH}$[1] rises up to the driving voltage $V_{PW}$ in a sufficiently short period; after that, until an up edge appears in the signal $S_{PWM}$[1], the terminal voltage $V_{CH}$[1] is kept at the driving voltage $V_{PW}$. After that, when an up edge appears in the signal $S_{PWM}$[1], the driving current $I_{LED}$[1] starts to be supplied again so that the terminal voltage $V_{CH}$[1] quickly falls down to the voltage ($V_{PW}$–Vf). In this way, in the normal condition, in the evaluation period $P_{EV}$, which belongs to the low-level period of the signal $S_{PWM}$[1], the terminal voltage $V_{CH}$ is equal to the driving voltage $V_{PW}$ (except in a period immediately after the start of the evaluation period $P_{EV}$ in which the terminal voltage $V_{CH}$ rises).

Figure 19:
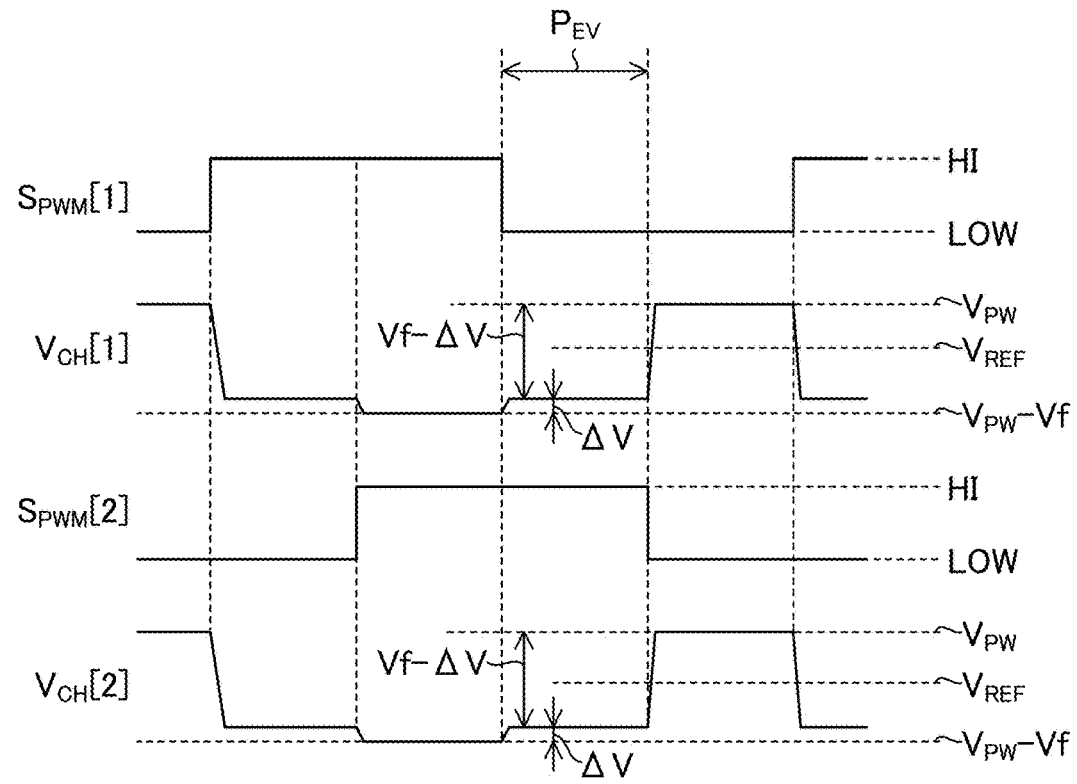
FIG. 19 is a diagram showing the relationship between PWM signals and terminal voltages in two channels in a short-circuited condition according to Practical Example EX2_A belonging to the embodiment of the present disclosure.

Next, consider a short-circuited condition where the connection terminals CH[1] and CH[2] are short-circuited together. FIG. 19 shows the waveforms of the signal $S_{PWM}$ and the terminal voltage $V_{CH}$ in the first and second channels in the short-circuited condition. In the short-circuited condition, the terminal voltages $V_{CH}$[1] and $V_{CH}$[2] are always equal.

In the short-circuited condition, when the signals $S_{PWM}$[1] and $S_{PWM}$[2] are both at high level, the light-emitting units LL[1] and LL[2] are each supplied with a driving current $I_{LED}$ with the set current value $VAL_{LED}$, and thus the terminal voltages $V_{CH}$[1] and $V_{CH}$[2] are equal to ($V_{PW}$–Vf) (except in a transient state).

In the short-circuited condition, when the signals $S_{PWM}$[1] and $S_{PWM}$[2] are both at low level, the charge circuits CG[1] and CG[2] output the charge currents $I_{CG}$[1] and $I_{CG}$[2] so that the terminal voltages $V_{CH}$[1] and $V_{CH}$[2] are equal to the driving voltage $V_{PW}$ (except in a transient state).

In the short-circuited condition, when the signal $S_{PWM}$[1] is at low level and the signal $S_{PWM}$[2] is at high level, the charge current $I_{CG}$[1] from the charge circuit CG[1] is drawn via the connection terminals CH[1] and CH[2] into the current driver DRV[2] and a current with the value ($VAL_{LED}$-$VAL_{CG}$) passes through the light-emitting units LL[1] and LL[2] in a manner distributed between them. Here, $VAL_{LED}$>>$VAL_{CG}$, and thus a current of approximately one-half of the set current value $VAL_{LED}$ passes through each of the light-emitting units LL[1] and LL[2]. As a result, in the short-circuited condition, when the signal $S_{PWM}$[1] is at low level and the signal $S_{PWM}$[2] is at high level, the terminal voltages $V_{CH}$[1] and $V_{CH}$[2] are higher than the voltage ($V_{PW}$–Vf) by ΔV (except in a transient state).

In the short-circuited condition, when the signal $S_{PWM}$[1] is at high level and the signal $S_{PWM}$[2] is at low level, the charge current $I_{CG}$[2] from the charge circuit CG[2] is drawn via the connection terminals CH[2] and CH[1] into the current driver DRV[1] and a current with the value ($VAL_{LED}$-$VAL_{CG}$) passes through the light-emitting units LL[1] and LL[2] in a manner distributed between them. Here, $VAL_{LED}$>>$VAL_{CG}$, and thus a current of approximately one-half of the set current value $VAL_{LED}$ passes through each of the light-emitting units LL[1] and LL[2]. As a result, in the short-circuited condition, when the signal $S_{PWM}$[1] is at high level and the signal $S_{PWM}$[2] is at low level, the terminal voltages $V_{CH}$[1] and $V_{CH}$[2] are higher than the voltage ($V_{PW}$–Vf) by ΔV (except in a transient state).

For example, the forward voltage Vf is about 0.8 V and the voltage ΔV is about 0.1 V. Here, the reference voltage $V_{REF}$ is set such that Vf–ΔV>$V_{PW}$–$V_{REF}$ holds.

As will be understood from a comparison between FIGS. 18 and 19, in the evaluation period $P_{EV}$, while in the normal condition $V_{CH}$[1]>$V_{REF}$ holds (except immediately after the start of the evaluation period $P_{EV}$), in the short-circuited condition $V_{CH}$[1]<$V_{REF}$ holds. By exploiting these characteristics, the comparison-judgment circuit 32 check for the presence or absence of a resistance value abnormality between the connection terminals CH[1] and CH[2].

Specifically, in the regular detection process β, the comparison-judgment circuit 32 compares the terminal voltage $V_{CH}$[1] in the evaluation period $P_{EV}$ with the reference voltage $V_{REF}$ and, if $V_{CH}$[1]>$V_{REF}$ holds, the comparison-judgment circuit 32 judges that a resistance value abnormality (e.g., short circuit) is present between the connection terminals CH[1] and CH[2].

Specifically, the comparison-judgment circuit 32 can take, as an evaluation time point, the time point occurring at the lapse of a predetermined waiting time Δt from the start of the evaluation period $P_{EV}$ and compare the terminal voltage $V_{CH}$[1] at the evaluation time point with the reference voltage $V_{REF}$. If the terminal voltage $V_{CH}$[1] at the evaluation time point is lower than the reference voltage $V_{REF}$, the comparison-judgment circuit 32 judges that a resistance value abnormality (e.g., short circuit) is present between the connection terminals CH[1] and CH[2]. If the terminal voltage $V_{CH}$[1] at the evaluation time point is equal to or higher than the reference voltage $V_{REF}$, the comparison-judgment circuit 32 judges that no resistance value abnormality is present between the connection terminals CH[1] and CH[2]. The evaluation time point belongs to the evaluation period $P_{EV}$. The waiting time Δt is the length of time for which to wait for the variation of the terminal voltage $V_{CH}$[1] resulting from the transition to the evaluation period $P_{EV}$ to settle to a certain degree, and is shorter than the length of the evaluation period $P_{EV}$.

In the evaluation period $P_{EV}$ in the normal condition in FIG. 18, the forward voltage appearing across the light-emitting unit LL[2] (i.e., the voltage at the high-potential terminal of the light-emitting unit LL[2] relative to the potential at the low-potential terminal of the light-emitting unit LL[2]) is the forward voltage Vf as observed with all the set current value $VAL_{LED}$ supplied to the light-emitting unit LL[2]. By contrast, in the evaluation period $P_{EV}$ in the short-circuited condition in FIG. 19, the forward voltage appearing across the light-emitting unit LL[2] is a voltage lower than the voltage Vf only by ΔV, that is, the voltage (Vf–ΔV). The reference voltage $V_{REF}$ is set with consideration given to the electrical characteristics of the light-emitting units LL (the relationship between the forward current and a forward voltage) and the current values $VAL_{LED}$ and $VAL_{CG}$ such that the voltage (Vf–ΔV) is greater than the difference between the driving voltage $V_{PW}$ and the reference voltage $V_{REF}$. This makes it possible to check for the presence or absence of a resistance value abnormality as described above. The constant current source CC2 can be configured such that the constant current $I_{CC2}$ has a variable value and the fault detection circuit 30 can adjust the value of the constant current $I_{CC2}$ with consideration given to the current value $VAL_{LED}$ and the like such that Vf–ΔV>$V_{PW}$–$V_{REF}$ holds.

With this practical example, it is possible to properly detect a resistance value abnormality (e.g., short circuit) between connection terminals in a period in which the regular light emission operation is performed.

While the regular detection process β according to this practical example has been described with focus on two adjacent connection terminals CH[1] and CH[2], the regular detection process β according to this practical example can be carried out for every combination of two adjacent connection terminals CH. Specifically, for example, in a case where the connection terminals CH[3] and CH[4] are adjacent to each other at one side (SD1, SD2, SD3, SD4) of the LED driver 1, the regular detection process β according to this practical example can be carried out also for the combination of the connection terminals CH[3] and CH[4].

Practical Example EX2_B

Practical Example EX2_B will be described. Practical Example EX2_B deals with a regular detection process β that can be executed suitably for three or more connection terminals CH arranged in a row along a predetermined direction.

For specific description, it is here assumed that the connection terminals CH[1] to CH[m] are arranged in a terminal array AR as shown in FIG. 9. The significance of the terminal array AR is as described in connection with Practical Example EX1_B. In Practical Example EX2_B, however, m can be any integer of three or more.

Figure 20:
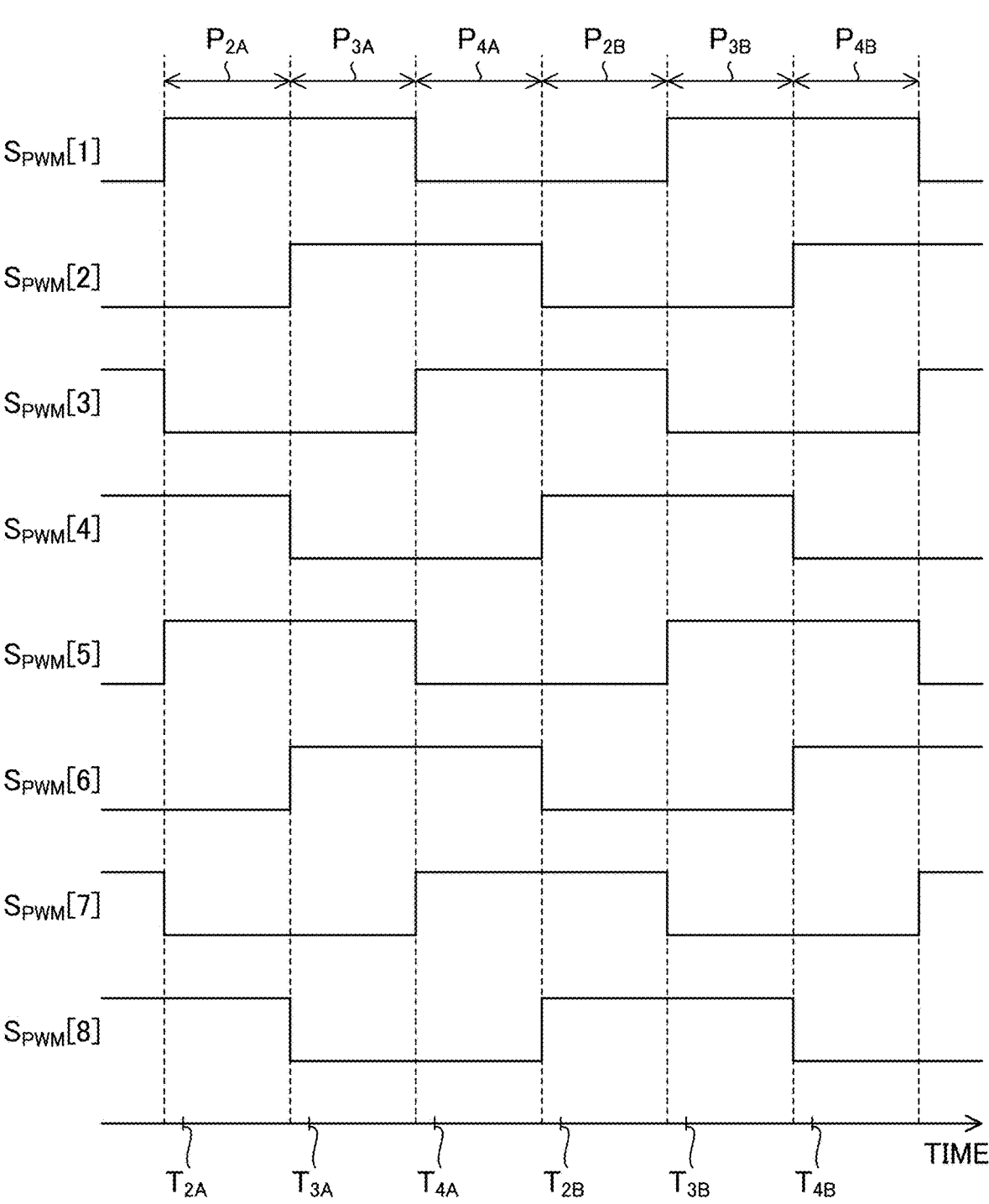
FIG. 20 is a diagram showing the relationship of a plurality of PWM signals with a plurality of evaluation periods according to Practical Example EX2_B belonging to the embodiment of the present disclosure.

Moreover, it is here assumed that m=8 and the signals $S_{PWM}[1]$ to $S_{PWM}[8]$ have waveforms as shown in FIG. 20. In the waveform example in FIG. 20, the signals $S_{PWM}[1]$ to $S_{PWM}[8]$ are each a rectangular-wave signal with a duty of 50%. That is, in each of the signals $S_{PWM}[1]$ to $S_{PWM}[8]$, the ratio of the length of the high-level period of the signal $S_{PWM}$ to the length of the low-level period of the signal $S_{PWM}$ is 1:1. The signals $S_{PWM}[1]$ to $S_{PWM}[8]$ have the same frequency. In the waveform example in FIG. 20, relative to the signal $S_{PWM}[1]$, the phases of the signals $S_{PWM}[2]$, $S_{PWM}[3]$, and $S_{PWM}[4]$ are delayed by 90°, 180°, and 270° respectively. The signals $S_{PWM}[1]$ and $S_{PWM}[5]$ have the same phase, the signal $S_{PWM}[2]$ and $S_{PWM}[6]$ have the same phase, the signal $S_{PWM}[3]$ and $S_{PWM}[7]$ have the same phase, and the signal $S_{PWM}[4]$ and $S_{PWM}[8]$ have the same phase.

Then, while the regular light emission operation is performed continuously, evaluation periods $P_{2A}$, $P_{3A}$, $P_{4A}$, $P_{2B}$, $P_{3B}$, and $P_{4B}$ occur repeatedly.

In the evaluation period $P_{2A}$, the signals $S_{PWM}[1]$, $S_{PWM}[4]$, $S_{PWM}[5]$, and $S_{PWM}[8]$ are at high level and the signals $S_{PWM}[2]$, $S_{PWM}[3]$, $S_{PWM}[6]$, and $S_{PWM}[7]$ are at low level.

In the evaluation period $P_{3A}$, the signals $S_{PWM}[1]$, $S_{PWM}[2]$, $S_{PWM}[5]$, and $S_{PWM}[6]$ are at high level and the signals $S_{PWM}[3]$, $S_{PWM}[4]$, $S_{PWM}[7]$, and $S_{PWM}[8]$ are at low level.

In the evaluation period $P_{4A}$, the signals $S_{PWM}[2]$, $S_{PWM}[3]$, $S_{PWM}[6]$, and $S_{PWM}[7]$ are at high level and the signals $S_{PWM}[1]$, $S_{PWM}[4]$, $S_{PWM}[5]$, and $S_{PWM}[8]$ are at low level.

In the evaluation period $P_{2B}$, the signals $S_{PWM}[3]$, $S_{PWM}[4]$, $S_{PWM}[7]$, and $S_{PWM}[8]$ are at high level and the signals $S_{PWM}[1]$, $S_{PWM}[2]$, $S_{PWM}[5]$, and $S_{PWM}[6]$ are at low level.

In the evaluation period $P_{3B}$, the signals $S_{PWM}[1]$, $S_{PWM}[4]$, $S_{PWM}[5]$, and $S_{PWM}[8]$ are at high level and the signals $S_{PWM}[2]$, $S_{PWM}[3]$, $S_{PWM}[6]$, and $S_{PWM}[7]$ are at low level. and In the evaluation period $P_{4B}$, the signals $S_{PWM}[1]$, $S_{PWM}[2]$, $S_{PWM}[5]$, and $S_{PWM}[6]$ are at high level and the signals $S_{PWM}[3]$, $S_{PWM}[4]$, $S_{PWM}[7]$, and $S_{PWM}[8]$ are at low level.

Time point $T_{2A}$ is an evaluation time point occurring at the lapse of the predetermined waiting time Δt from the start of the evaluation period $P_{2A}$. The evaluation time point $T_{2A}$ belongs to the evaluation period $P_{2A}$.

Time point $T_{3A}$ is an evaluation time point occurring at the lapse of the predetermined waiting time Δt from the start of the evaluation period $P_{3A}$. The evaluation time point $T_{3A}$ belongs to the evaluation period $P_{3A}$.

Time point $T_{4A}$ is an evaluation time point occurring at the lapse of the predetermined waiting time Δt from the start of the evaluation period $P_{4A}$. The evaluation time point $T_{4A}$ belongs to the evaluation period $P_{4A}$.

Time point $T_{2B}$ is an evaluation time point occurring at the lapse of the predetermined waiting time Δt from the start of the evaluation period $P_{2B}$. The evaluation time point $T_{2B}$ belongs to the evaluation period $P_{2B}$.

Time point $T_{3B}$ is an evaluation time point occurring at the lapse of the predetermined waiting time Δt from the start of the evaluation period $P_{3B}$. The evaluation time point $T_{3B}$ belongs to the evaluation period $P_{3B}$.

Time point $T_{4B}$ is an evaluation time point occurring at the lapse of the predetermined waiting time Δt from the start of the evaluation period $P_{4B}$. The evaluation time point $T_{4B}$ belongs to the evaluation period $P_{4B}$.

In the evaluation period $P_{2A}$, the charge circuits CG[2] and CG[3] supply the connection terminals CH[2] and CH[3] with the charge currents $I_{CG}[2]$ and $I_{CG}[3]$, and the current driver DRV[1] supplies the light-emitting unit LL[1] corresponding to the connection terminals CH[1] with the driving current $I_{LED}[1]$.

The comparison-judgment circuit 32 compares the terminal voltage $V_{CH}[2]$ at the evaluation time point $T_{2A}$ with the reference voltage $V_{REF}$. If the terminal voltage $V_{CH}[2]$ at the evaluation time point $T_{2A}$ is lower than the reference voltage $V_{REF}$, the comparison-judgment circuit 32 judges that a resistance value abnormality (e.g., short circuit) is present between the connection terminals CH[1] and CH[2]. If the terminal voltage $V_{CH}[2]$ at the evaluation time point $T_{2A}$ is equal to or higher than the reference voltage $V_{REF}$, the comparison-judgment circuit 32 judges that no resistance value abnormality is present between the connection terminals CH[1] and CH[2]. The waiting time Δt is the time for which to wait for the variation of the terminal voltage $V_{CH}[2]$ that can result from the transition to the evaluation period $P_{2A}$ to settle to a certain degree, and is shorter than the length of the evaluation period $P_{2A}$.

In the evaluation period $P_{2B}$, the charge circuits CG[1] and CG[2] supply the connection terminals CH[1] and CH[2] with the charge currents $I_{CG}[1]$ and $I_{CG}[2]$, and the current driver DRV[3] supplies the light-emitting unit LL[3] corresponding to the connection terminals CH[3] with the driving current $I_{LED}[3]$.

The comparison-judgment circuit 32 compares the terminal voltage $V_{CH}[2]$ at the evaluation time point $T_{2B}$ with the reference voltage $V_{REF}$. If the terminal voltage $V_{CH}[2]$ at the evaluation time point $T_{2B}$ is lower than the reference voltage $V_{REF}$, the comparison-judgment circuit 32 judges that a resistance value abnormality (e.g., short circuit) is present between the connection terminals CH[2] and CH[3]. If the terminal voltage $V_{CH}[2]$ at the evaluation time point $T_{2B}$ is equal to or higher than the reference voltage $V_{REF}$, the comparison-judgment circuit 32 judges that no resistance value abnormality is present between the connection terminals CH[2] and CH[3]. The waiting time Δt is the time for which to wait for the variation of the terminal voltage $V_{CH}[2]$ that can result from the transition to the evaluation period $P_{2B}$ to settle to a certain degree, and is shorter than the length of the evaluation period $P_{2B}$.

In the evaluation period $P_{2A}$, if the dielectric resistance between the connection terminals CH[1] and CH[2] is sufficiently high, the forward voltage appearing across the light-emitting unit LL[1] (i.e., the voltage at the high-potential terminal of the light-emitting unit LL[1] relative to the potential at the low-potential terminal of the light-emitting unit LL[1]) is the forward voltage Vf as observed when all the set current value $VAL_{LED}$ is supplied to the light-emitting unit LL[1]. By contrast, in the evaluation period $P_{2A}$, if the connection terminals CH[1] and CH[2] are short-circuited together, as in the short-circuited condition in FIG. 19, the forward voltage appearing across the light-emitting unit LL[1] is a voltage lower than the voltage Vf by the voltage $\Delta V$, that is, the voltage (Vf–$\Delta V$).

In the evaluation period $P_{2B}$, if the dielectric resistance between the connection terminals CH[2] and CH[3] is sufficiently high, the forward voltage appearing across the light-emitting unit LL[3] (i.e., the voltage at the high-potential terminal of the light-emitting unit LL[3] relative to the potential at the low-potential terminal of the light-emitting unit LL[3]) is the forward voltage Vf as observed when all the set current value $VAL_{LED}$ is supplied to the light-emitting unit LL[3]. By contrast, in the evaluation period $P_{2B}$, if the connection terminals CH[2] and CH[3] are short-circuited together, as in the short-circuited condition in FIG. 19, the forward voltage appearing across the light-emitting unit LL[3] is a voltage lower than the voltage Vf by the voltage $\Delta V$, that is, the voltage (Vf–$\Delta V$).

Here, the reference voltage $V_{REF}$ is set with consideration given to the electrical characteristics of the light-emitting units LL (the relationship between the forward current and a forward voltage) and the current values $VAL_{LED}$ and $VAL_{CG}$ such that the voltage (Vf–$\Delta V$) is greater than the difference between the driving voltage $V_{PW}$ and the reference voltage $V_{REF}$. This makes it possible to check for the presence or absence of a resistance value abnormality as described above. The constant current source CC2 can be configured such that the constant current $I_{CC2}$ has a variable value and the fault detection circuit 30 can adjust the value of the constant current $I_{CC2}$ with consideration given to the current value $VAL_{LED}$ and the like such that Vf–$\Delta V > V_{PW}$–$V_{REF}$ holds.

While a method for detecting an abnormal resistance value between adjacent connection terminals has been described with focus on a group of terminals comprising the connection terminals CH[1], CH[2], and CH[3], similar detection is possible for any other group of terminals. Specifically, for example, the comparison-judgment circuit 32 can compare the terminal voltage $V_{CH}$[3] at the evaluation time point $T_{3A}$ with the reference voltage $V_{REF}$. Then, if the terminal voltage $V_{CH}$[3] at the evaluation time point $T_{3A}$ is lower than the reference voltage $V_{REF}$, the comparison-judgment circuit 32 can judge that a resistance value abnormality (e.g., short circuit) is present between the connection terminals CH[2] and CH[3]; otherwise the comparison-judgment circuit 32 can judge that no resistance value abnormality is present between the connection terminals CH[2] and CH[3]. Likewise, for example, the comparison-judgment circuit 32 can compare the terminal voltage $V_{CH}$[3] at the evaluation time point $T_{3B}$ with the reference voltage $V_{REF}$. Then, if the terminal voltage $V_{CH}$[3] at the evaluation time point $T_{3B}$ is lower than the reference voltage $V_{REF}$, the comparison-judgment circuit 32 can judge that a resistance value abnormality (e.g., short circuit) is present between the connection terminals CH[3] and CH[4]; otherwise the comparison-judgment circuit 32 can judge that no resistance value abnormality is present between the connection terminals CH[3] and CH[4].

It can be understood as follows. In each evaluation period, a group of evaluation terminals comprising a first, a second, and a third evaluation terminals are taken as the target for abnormal resistance value detection. Here, the first, second, and third evaluation terminals are arrayed in a row along a predetermined direction, with the second evaluation terminal disposed between the first and the third evaluation terminals. In an evaluation period, the signal $S_{PWM}$ corresponding to one of the first and third evaluation terminals is at high level and the signal $S_{PWM}$ corresponding to the other is at low level and in addition the signal $S_{PWM}$ corresponding to the second evaluation terminal is at low level. A case where the signal $S_{PWM}$ corresponding to the first evaluation terminal is at high level will be referred to as Case 1, and a case where the signal $S_{PWM}$ corresponding to the third evaluation terminal is at high level will be referred to as Case 2.

In Case 1, the comparison-judgment circuit 32 compares the voltage at the second evaluation terminal at an evaluation time point in an evaluation period with the reference voltage $V_{REF}$ to judge, if the voltage at the second evaluation terminal is lower than the reference voltage $V_{REF}$, that a resistance value abnormality (e.g., short circuit) is present between the first and second evaluation terminals and, otherwise, that no resistance value abnormality is present between the first and second evaluation terminals. In Case 2, the comparison-judgment circuit 32 compares the voltage at the second evaluation terminal at an evaluation time point in an evaluation period with the reference voltage $V_{REF}$ to judge, if the voltage at the second evaluation terminal is lower than the reference voltage $V_{REF}$, that a resistance value abnormality (e.g., short circuit) is present between the second and third evaluation terminals and, otherwise, that no resistance value abnormality is present between the second and third evaluation terminals.

In the evaluation period $P_{2A}$, the group of the connection terminals CH[1] to CH[3], the group of the connection terminals CH[2] to CH[4], the group of the connection terminals CH[5] to CH[7], and the group of the connection terminals CH[6] to CH[8] can each function as an evaluation target group. In the evaluation period $P_{3A}$, the group of the connection terminals CH[2] to CH[4], the group of the connection terminals CH[3] to CH[5], and the group of the connection terminals CH[6] to CH[8] can each function as an evaluation target group. For any other evaluation period, an evaluation target group can be set in a similar manner.

By a method according to this practical example, in a period in which the regular light emission operation is performed, it is possible to detect a resistance value abnormality between the connection terminals CH[1] and CH[2], a resistance value abnormality between the connection terminals CH[2] and CH[3], . . . and a resistance value abnormality between the connection terminals CH[m–1] and CH[m] while distinguishing among these. Identifying the location of a resistance value abnormality facilitates the subsequent course of action such as maintenance, repair, or a review of the production procedure.

Note that, in the example in FIG. 20, the connection terminal CH located at an end of the group of terminals comprising the connection terminals CH[1] to CH[8] can be coped with by the regular detection process $\beta$ described in connection with Practical Example EX2_A. That is, detection of a resistance value abnormality between the connection terminals CH[1] and CH[2] can be coped with by the regular detection process β described in connection with Practical Example EX2_A. The same is true with detection of a resistance value abnormality between the connection terminals CH[7] and CH[8].

The regular detection process β can be executed, after the start of PWM driving in the regular light emission operation, in each period of the signal $S_{PWM}$ for each combination of two adjacent connection terminals CH. Or the regular detection process β can be performed, after the start of PWM driving in the regular light emission operation, at least once for each combination of two adjacent connection terminals CH.

Incidentally, the main control circuit 20 can generate the signal $S_{PWM}$ for each channel based on a PWM signal (pulse-width-modulation signal) fed from the MPU 2. In a case where the PWM signal fed from the MPU 2 is a single PWM signal, the main control circuit 20 can generate, based on the single PWM signal, a first to a fourth PWM signal with phases shifted by 90° from one another. The main control circuit 20 can then use the first PWM signal as the signals $S_{PWM}[1]$ and $S_{PWM}[5]$, the second PWM signal as the signals $S_{PWM}[2]$ and $S_{PWM}[6]$, the third PWM signal as the signals $S_{PWM}[3]$ and $S_{PWM}[7]$, and the fourth PWM signal as the signals $S_{PWM}[4]$ and $S_{PWM}[8]$.

The first to fourth PWM signals can be fed from the MPU 2 to the LED driver 1. In that case, the main control circuit 20 can use the first PWM signal fed from the MPU 2 as the signals $S_{PWM}[1]$ and $S_{PWM}[5]$, the second PWM signal fed from the MPU 2 as the signals $S_{PWM}[2]$ and $S_{PWM}[6]$, the third PWM signal fed from the MPU 2 as the signals $S_{PWM}[3]$ and $S_{PWM}[7]$, and the fourth PWM signal fed from the MPU 2 as the signals $S_{PWM}[4]$ and $S_{PWM}[8]$. In a case where the first to fourth PWM signals mentioned above are fed from the MPU 2 to the LED driver 1, which PWM signal to assign to which channel can be specified with a command from the MPU 2 to the LED driver 1.

While the example described above deals with a case where the phase difference between the two signals $S_{PWM}$ corresponding to two adjacent connection terminals CH is 90°, the phase difference can be other than 90°, for example, 45° or 60°.

Practical Example EX3

Practical Example EX3 will be described. Practical Example EX3 deals with modified technologies and the like that are applicable to what has been described above.

In the present disclosure, any light-emitting unit LL can be composed of one or more light-emitting elements that emit light when supplied with an electric current. An LED as a light-emitting element can be any type of light-emitting diode, and can be an organic LED that produces organic EL (organic electroluminescence). A light-emitting element can be one that is not classified as an LED, and can be, for example, a laser diode.

The LED driver 1 is an example of a light-emitting element driving device for driving a light-emitting unit LL, and the above embodiment deals with an example where the technologies according to the present disclosure (including the technology for detecting a resistance value abnormality) are applied to a light-emitting element driving device. However, the technologies according to the present disclosure can be applied to any devices. Specifically, for example, the technology for detecting a resistance value abnormality according to the present disclosure can be employed to detect the presence or absence of an resistance value abnormality between any two adjacent terminals provided in ay device.

For any signal or voltage, the relationship of its high and low levels can be reversed unless inconsistent with what is disclosed herein.

Embodiments of the present disclosure can be modified in many ways as necessary without departure from the scope of the technical ideas defined in the appended claims. The embodiments described herein are merely examples of how the present invention can be implemented, and what is meant by any of the terms used to describe the present invention and its constituent elements is not limited to that mentioned in connection with the embodiments. The specific values mentioned in the above description are merely illustrative and needless to say can be modified to different values.

<<First Notes>>

To follow are first notes on the present disclosure, of which specific configuration examples are presented in connection with the embodiment described above. The first motes correspond, in particular, to the initial detection process α.

According to one aspect of the present disclosure, a light-emitting element driving device (1) (see Practical Examples EX1_A to EX1_C) that has connection terminals (CH) for a plurality of channels and that is configured to be operable, for each channel, to supply a light-emitting unit (LL) provided between a wire ($PW_{WR}$) to which a driving voltage ($V_{PW}$) is applied and a connection terminal with a driving current ($I_{LED}$) for the light-emitting unit via the connection terminal includes: a voltage generation circuit (40) configured to generate, based on the driving voltage, a first voltage (V1) at a first node (ND1) and a second voltage (V2) at a second node (ND2); and a fault detection circuit (30) configured to execute a fault detection process in a period in which each light-emitting unit is not supplied with the driving current. For each channel, a switch circuit (SW[i]) is provided between the connection terminal and the voltage generation circuit. The first and second voltages are lower than the driving voltage and, with each connection terminal cut off from the first and second nodes, the second voltage is lower than the first voltage. The fault detection circuit controls the state of each switch circuit and, in the fault detection process, brings into an evaluation state (for example, the evaluation state $ST_{1A}$ in FIG. 7) two switch circuits corresponding to, among the plurality of connection terminals, two adjacent connection terminals. In the evaluation state, of the two connection terminals, one connection terminal (e.g., CH[1]) is connected to the second node and the other connection terminal (for example, CH[2]) is connected to the first node. In the fault detection process, the fault detection circuit detects a resistance value abnormality between the two connection terminals based on the voltage (for example, $V_{CH}[1]$) at the one connection terminal in the evaluation state. (Hereinafter referred to as Configuration $W_{A1}$.)

With this configuration, it is possible to detect a resistance value abnormality (e.g., short circuit) between two connection terminals. Although in the fault detection process the first or second voltage lower than the driving voltage is applied to the connection terminals, employing a configuration where the first and second voltages are generated from the driving voltage makes it possible to keep the voltage applied to the light-emitting unit so low that the light-emitting unit does not emit light. It is thus possible to prevent the light-emitting unit from emitting light for the resistance value abnormality detection process.

The light-emitting element driving device according to Configuration $W_{A1}$ can further include a reference voltage generation circuit (50) configured to generate a reference voltage ($V_{REF}$) based on the driving voltage. With each connection terminal cut off from the first and second nodes, the reference voltage can be lower than the first voltage and higher than the second voltage. In the fault detection process, the fault detection circuit can compare the voltage (e.g., $V_{CH}[1]$) at the one connection terminal in the evaluation state with the reference voltage and thereby detect the resistance value abnormality between the two connection terminal. (Hereinafter referred to as Configuration $W_{A2}$.)

In the light-emitting element driving device of Configuration $W_{A2}$, if the voltage (e.g., $V_{CH}[1]$) at the one connection terminal in the evaluation state is higher than the reference voltage, the fault detection circuit can judge that the resistance value abnormality is present between the two connection terminals. (Hereinafter referred to as Configuration $W_{A3}$.)

In the light-emitting element driving device of Configuration $W_{A1}$, the plurality of connection terminals can include a first to an mth connection terminal arrayed in a row along a predetermined direction (where m is an integer of four or more; see FIG. 9). In the fault detection process, the fault detection circuit can bring a first to an mth switch circuit (SW[1] to SW[m]) corresponding to the first to mth connection terminals into a first to an mth evaluation state sequentially (see FIG. 11). In the ith evaluation state, of the first to mth connection terminals, the ith connection terminal can be connected to the second node and a connection terminal adjacent to the ith connection terminal can be connected to the first node (where i is a natural number of m or less). In the fault detection process, the fault detection circuit can detect, based on the voltage ($V_{CH}[i]$) at the ith connection terminal in the ith evaluation state, a resistance value abnormality between the ith connection terminal and the connection terminal adjacent to the ith connection terminal. (Hereinafter referred to as Configuration $W_{A4}$.)

With this configuration, it is possible to detect a resistance value abnormality for each combination of two adjacent connection terminals.

The light-emitting element driving device of Configuration $W_{A4}$ can further include a reference voltage generation circuit (50) configured to generate a reference voltage ($V_{REF}$) based on the driving voltage. With each connection terminal cut off from the first and second nodes, the reference voltage can be lower than the first voltage and higher than the second voltage. In the fault detection process, the fault detection circuit can compare the voltage ($V_{CH}[i]$) at the ith connection terminal in the ith the evaluation state with the reference voltage and thereby detect a resistance value abnormality between the ith connection terminal and the connection terminal adjacent to the ith connection terminal. (Hereinafter referred to as Configuration WAS.)

In the light-emitting element driving device of Configuration WAS, if the voltage ($V_{CH}[i]$) at the ith connection terminal in the ith evaluation state is higher than the reference voltage, the fault detection circuit can judge that the resistance value abnormality is present between the ith connection terminal and the connection terminal adjacent to the ith connection terminal. (Hereinafter referred to as Configuration $W_{A6}$.)

In the light-emitting element driving device of Configuration $W_{A4}$, the first to mth connection terminals can be arrayed in this order along the predetermined direction. In the fault detection process, the fault detection circuit can, based on the voltage at the first connection terminal in the first evaluation state, the voltage at the second connection terminal in the second evaluation state, . . . and the voltage at the mth connection terminal in the mth evaluation state, detect, while distinguishing among, a resistance value abnormality between the first connection terminal and the second connection terminal, a resistance value abnormality between the second connection terminal and the third connection terminal, . . . and a resistance value abnormality between the (m−1)th connection terminal and the mth connection terminal. (Hereinafter referred to as Configuration $W_{A7}$.)

With these configurations, it is possible to detect a resistance value abnormality and in addition identify where the resistance value abnormality is present.

The light-emitting element driving device of Configuration $W_{A7}$ can further include a reference voltage generation circuit (50) configured to generate a reference voltage ($V_{REF}$) based on the driving voltage. With each connection terminal cut off from the first and second nodes, the reference voltage can be lower than the first voltage and higher than the second voltage. In the fault detection process, the fault detection circuit can compare each of the voltage at the first connection terminal in the first evaluation state, the voltage at the second connection terminal in the second evaluation state, . . . and the voltage at the mth connection terminal in the mth evaluation state with the reference voltage and thereby detect, while distinguishing among, the resistance value abnormality between the first and second connection terminals, the resistance value abnormality between the second and third connection terminals, . . . and the resistance value abnormality between the (m−1)th and mth connection terminals. (Hereinafter referred to as Configuration $W_{A8}$.)

In the light-emitting element driving device of Configuration $W_{A8}$, if the voltage at the jth connection terminal in the jth evaluation state is higher than the reference voltage and in addition the voltage at the (j+1)th connection terminal in the (j+1)th evaluation state is higher than the reference voltage, the fault detection circuit can judge that the resistance value abnormality is present between the jth and (j+1)th connection terminals (where j is a natural number of (m−1) or less). (Hereinafter referred to as Configuration $W_{A9}$.)

In the light-emitting element driving device of any of Configurations $W_{A1}$ to $W_{A9}$, with each connection terminal cut off from the first and second nodes, the difference between the driving voltage and the second voltage can be lower than the forward voltage ($Vf_{REF}$) across each light-emitting unit required to make it emit light. (Hereinafter referred to as Configuration $W_{A10}$.)

With this configuration, it is possible to prevent the light-emitting unit from emitting light in the resistance value abnormality detection process in a period in which the driving current is not supplied.

In the light-emitting element driving device of any of Configurations $W_{A1}$ to $W_{A9}$, a short circuit between the two connection terminals can constitute the resistance value abnormality between the two connection terminals. (Hereinafter referred to as Configuration $W_{A11}$.)

<<Second Notes>>

To follow are second notes on the present disclosure, of which specific configuration examples are presented in connection with the embodiment described above. The second motes correspond, in particular, to the regular detection process β.

According to another aspect of the present disclosure, a light-emitting element driving device (1) (see Practical Examples EX2_A to EX2_B) that has connection terminals (CH) for a plurality of channels and that is configured to be operable, for each channel, to supply a light-emitting unit (LL) provided between a wire ($PW_{WR}$) to which a driving voltage ($V_{PW}$) is applied and a connection terminal with a driving current ($I_{LED}$) for the light-emitting unit via the connection terminal includes a fault detection circuit (30) configured to execute a fault detection process in a period in which each light-emitting unit is supplied with a pulse-width-modulated current as the driving current. For each channel, a driving current supply circuit (DRV) and a charge circuit (CG) are provided. For each channel, the driving current supply circuit (DRV[i]) receives a PWM signal ($S_{PWM}$[i]) so that, when the PWM signal is at a first level (e.g., high level), the driving current supply circuit supplies the driving current ($I_{LED}$[i]) to the corresponding light-emitting unit (LL[i]) via the corresponding connection terminal (CH[i]) and, when the PWM signal is at a second level (e.g., low level), the driving current supply circuit suspends supplying the driving current to the corresponding light-emitting unit. For each channel, the charge circuit (CG[i]), when the PWM signal for the corresponding driving current supply circuit (DRV[i]) is at a second level, supplies a charge current ($I_{CC}$[i]) to the corresponding connection terminal (CH[i]). With respect to two adjacent connection terminals included in the plurality of connection terminals, an evaluation period (e.g., $P_{EV}$; see FIGS. 18 and 19) is set such that, during that period, a period in which the charge current is supplied to one connection terminal (e.g., CH[1]; see FIG. 17) overlaps with a period in which the driving current is supplied to the light-emitting unit (e.g., LL[2]) corresponding to the other connection terminal (e.g., CH[2]). In the fault detection process, the fault detection circuit detects a resistance value abnormality between the two connection terminals based on the voltage (e.g., $V_{CH}$[1]) at the one connection terminal in the evaluation period. (Hereinafter referred to as Configuration $W_{B1}$.)

With this configuration, it is possible to detect a resistance value abnormality (e.g., short circuit) in a period in which each light-emitting unit is driven.

The light-emitting element driving device of Configuration $W_{B1}$ can further include a reference voltage generation circuit (50) configured to generate based on the driving voltage a reference voltage ($V_{REF}$) lower than the driving voltage. In the fault detection process, the fault detection circuit can compare the voltage (e.g., $V_{CH}$[1]) at the one connection terminal in the evaluation period with the reference voltage and thereby detect the resistance value abnormality between the two connection terminals. (Hereinafter referred to as Configuration $W_{B2}$.)

In the light-emitting element driving device of Configuration $W_{B2}$, if the voltage (e.g., $V_{CH}$[1]) at the one connection terminal in the evaluation period is lower than the reference voltage, the fault detection circuit can judge that the resistance value abnormality is present between the two connection terminals. (Hereinafter referred to as Configuration $W_{B3}$.)

In the light-emitting element driving device of Configuration $W_{B3}$, in the evaluation period with the two connection terminals short-circuited together, the magnitude of the forward voltage (Vf–ΔV) appearing across the light-emitting unit corresponding to the other connection terminal can be greater than the difference between the driving voltage and the reference voltage. (Hereinafter referred to as Configuration $W_{B4}$.)

With this configuration, it is possible to properly detect a resistance value abnormality (e.g., short circuit) between connection terminals.

In the light-emitting element driving device of Configuration $W_{B1}$, the plurality of connection terminals can include a first, a second, and a third connection terminal (e.g., CH[1] to CH[3]) arrayed in a row along a predetermined direction, with the second connection terminal disposed between the first and third connection terminals. The evaluation period can be a period (e.g., the evaluation period $P_{2A}$ in FIG. 20) in which the second and third connection terminals are supplied with the charge current and the light-emitting unit corresponding to the first connection terminal is supplied with the driving current. The fault detection circuit can detect a resistance value abnormality between the first and second connection terminals based on the voltage (e.g., $V_{CH}$[2]) at the second terminal in the evaluation period. (Hereinafter referred to as Configuration $W_{B5}$.)

With this configuration, with respect to three connection terminals arrayed in a row, it is possible to detect a resistance value abnormality (e.g., short circuit) between the connection terminal located in the middle and the connection terminals adjacent to it.

The light-emitting element driving device of Configuration WBs can further include a reference voltage generation circuit (50) configured to generate based on the driving voltage a reference voltage ($V_{REF}$) lower than the driving voltage. In the fault detection process, the fault detection circuit can compare the voltage (e.g., $V_{CH}$[2]) at the second connection terminal in the evaluation period with the reference voltage and thereby detect the resistance value abnormality between the first and second connection terminals. (Hereinafter referred to as Configuration $W_{B6}$.)

In the light-emitting element driving device of Configuration $W_{B6}$, if the voltage (e.g., $V_{CH}$[2]) at the second connection terminal in the evaluation period is lower than the reference voltage, the fault detection circuit can judge that the resistance value abnormality is present between the first and second connection terminals. (Hereinafter referred to as Configuration $W_{B7}$.)

In the light-emitting element driving device of Configuration $W_{B7}$, in the evaluation period with the first and second connection terminals short-circuited together, the magnitude of the forward voltage (Vf–ΔV) appearing across the light-emitting unit corresponding to the first connection terminal can be greater than the difference between the driving voltage and the reference voltage. (Hereinafter referred to as Configuration $W_{B8}$.)

With this configuration, with respect to three connection terminals arrayed in a row, it is possible to properly detect a resistance value abnormality (e.g., short circuit) between the connection terminal located in the middle and the connection terminals adjacent to it.

In the light-emitting element driving device of Configuration $W_{B1}$, the plurality of connection terminals can include a first, a second, and a third connection terminal (e.g., CH[1] to CH[3]) arrayed in a row along a predetermined direction, with the second connection terminal disposed between the first and third connection terminals. The evaluation period can include a first evaluation period (e.g., the evaluation period $P_{2A}$ in FIG. 20) in which the second and third connection terminals are supplied with the charge current and the light-emitting unit corresponding to the first connection terminal is supplied with the driving current and a second evaluation period (e.g., the evaluation period $P_{2B}$ in FIG. 20) in which the first and second connection terminals are supplied with the charge current and the light-emitting unit corresponding to the third connection terminal is supplied with the driving current. The fault detection circuit can detect the resistance value abnormality between the first and second connection terminals based on the voltage (e.g., $V_{CH}[2]$) at the second connection terminal in the first evaluation period and detect the resistance value abnormality between the second and third connection terminals based on the voltage (e.g., $V_{CH}[2]$) at the second connection terminal in the second evaluation period (Hereinafter referred to as Configuration $W_{B9}$.)

With this configuration, with respect to three connection terminals arrayed in a row, it is possible to individually detect a resistance value abnormality (e.g., short circuit) between the connection terminal located in the middle and the connection terminals adjacent to it.

The light-emitting element driving device of Configuration $W_{B9}$ can further include a reference voltage generation circuit (50) configured to generate based on the driving voltage a reference voltage ($V_{REF}$) lower than the driving voltage. In the fault detection process, the fault detection circuit can compare the voltage (e.g., $V_{CH}[2]$) at the second connection terminal in the first evaluation period with the reference voltage and thereby detect a resistance value abnormality between the first and second connection terminals, and can compare the voltage (e.g., $V_{CH}[2]$) at the second connection terminal in the second evaluation period with the reference voltage and thereby detect the resistance value abnormality between the second and third connection terminals. (Hereinafter referred to as Configuration $W_{B10}$.)

In the light-emitting element driving device of Configuration $W_{B10}$, if the voltage at the second connection terminal in the first evaluation period is lower than the reference voltage, the fault detection circuit can judge that the resistance value abnormality is present between the first and second connection terminals and, if the voltage at the second connection terminal in the second evaluation period is lower than the reference voltage, the fault detection circuit can judge that the resistance value abnormality is present between the second and third connection terminals. (Hereinafter referred to as Configuration $W_{B11}$.)

In the light-emitting element driving device of Configuration $W_{B11}$, in the first evaluation period with the first and second connection terminals short-circuited together, the magnitude of the forward voltage (Vf–ΔV) appearing across the light-emitting unit corresponding to the first connection terminal can be greater than the difference between the driving voltage and the reference voltage and, in the second evaluation period with the second and third connection terminals short-circuited together, the magnitude of the forward voltage (Vf–ΔV) appearing across the light-emitting unit corresponding to the third connection terminal can be greater than the difference between the driving voltage and the reference voltage. (Hereinafter referred to as Configuration $W_{B12}$.)

With these configurations, with respect to three connection terminals arrayed in a row, it is possible to individually and properly detect a resistance value abnormality (e.g., short circuit) between the connection terminal located in the middle and the two connection terminals adjacent to it.

In the light-emitting element driving device of any of Configurations $W_{B1}$ to $W_{B12}$, a short circuit between the two connection terminals can constitute a resistance value abnormality between the two connection terminals. (Hereinafter referred to as Configuration $W_{B13}$.)

The invention claimed is:

1. A light-emitting element driving device having connection terminals for a plurality of channels, the light-emitting element driving device being configured to be operable, for each channel, to supply a light-emitting unit provided between a wire to which a driving voltage is applied and a connection terminal with a driving current for the light-emitting unit via the connection terminal, the light-emitting element driving device comprising:

a voltage generation circuit configured to generate, based on the driving voltage, a first voltage at a first node and a second voltage at a second node; and a fault detection circuit configured to execute a fault detection process in a period in which each light-emitting unit is not supplied with the driving current, wherein for each channel, a switch circuit is provided between the connection terminal and the voltage generation circuit, the first and second voltages are lower than the driving voltage and, with each connection terminal cut off from the first and second nodes, the second voltage is lower than the first voltage, the fault detection circuit controls a state of each switch circuit and, in the fault detection process, brings into an evaluation state two switch circuits corresponding to, among a plurality of connection terminals, two adjacent connection terminals, in the evaluation state, of the two connection terminals, one connection terminal is connected to the second node and another connection terminal is connected to the first node, and in the fault detection process, the fault detection circuit detects a resistance value abnormality between the two connection terminals based on a voltage at the one connection terminal in the evaluation state.

2. The light-emitting element driving device according to claim 1, further comprising:

a reference voltage generation circuit configured to generate a reference voltage based on the driving voltage, wherein with each connection terminal cut off from the first and second nodes, the reference voltage is lower than the first voltage and higher than the second voltage, in the fault detection process, the fault detection circuit compares the voltage at the one connection terminal in the evaluation state with the reference voltage and thereby detects the resistance value abnormality between the two connection terminal.

3. The light-emitting element driving device according to claim 2, wherein if the voltage at the one connection terminal in the evaluation state is higher than the reference voltage, the fault detection circuit judges that the resistance value abnormality is present between the two connection terminals.

4. The light-emitting element driving device according to claim 1, wherein the plurality of connection terminals includes a first to an mth connection terminal arrayed in a row along a predetermined direction (where m is an integer of four or more), in the fault detection process, the fault detection circuit brings a first to an mth switch circuit corresponding to the first to mth connection terminals into a first to an mth evaluation state sequentially, in an ith evaluation state, of the first to mth connection terminals, an ith connection terminal is connected to the second node and a connection terminal adjacent to the ith connection terminal is connected to the first node (where i is a natural number of m or less), and in the fault detection process, the fault detection circuit detects, based on a voltage at the ith connection terminal in the ith evaluation state, a resistance value abnormality between the ith connection terminal and the connection terminal adjacent to the ith connection terminal.

5. The light-emitting element driving device according to claim 4, further comprising:

a reference voltage generation circuit configured to generate a reference voltage based on the driving voltage, wherein with each connection terminal cut off from the first and second nodes, the reference voltage is lower than the first voltage and higher than the second voltage, and in the fault detection process, the fault detection circuit compares the voltage at the ith connection terminal in ith the evaluation state with the reference voltage and thereby detects the resistance value abnormality between the ith connection terminal and the connection terminal adjacent to the ith connection terminal.

6. The light-emitting element driving device according to claim 5, wherein if the voltage at the ith connection terminal in the ith evaluation state is higher than the reference voltage, the fault detection circuit judges that the resistance value abnormality is present between the ith connection terminal and the connection terminal adjacent to the ith connection terminal.

7. The light-emitting element driving device according to claim 4, wherein the first to mth connection terminals are arrayed in this order along the predetermined direction, and in the fault detection process, the fault detection circuit, based on a voltage at the first connection terminal in a first evaluation state, a voltage at a second connection terminal in a second evaluation state, . . . and a voltage at the mth connection terminal in the mth evaluation state, detects, while distinguishing among, a resistance value abnormality between the first connection terminal and the second connection terminal, a resistance value abnormality between the second connection terminal and a third connection terminal, . . . and a resistance value abnormality between an (m−1)th connection terminal and the mth connection terminal.

8. The light-emitting element driving device according to claim 7, further comprising:

a reference voltage generation circuit configured to generate a reference voltage based on the driving voltage, wherein with each connection terminal cut off from the first and second nodes, the reference voltage is lower than the first voltage and higher than the second voltage, in the fault detection process, the fault detection circuit compares each of the voltage at the first connection terminal in the first evaluation state, the voltage at the second connection terminal in the second evaluation state, . . . and the voltage at the mth connection terminal in the mth evaluation state with the reference voltage and thereby detects, while distinguishing among, the resistance value abnormality between the first and second connection terminals, the resistance value abnormality between the second and third connection terminals, . . . and the resistance value abnormality between the (m−1)th and mth connection terminals.

9. The light-emitting element driving device according to claim 8, wherein if a voltage at a jth connection terminal in a jth evaluation state is higher than the reference voltage and in addition a voltage at a (j+1)th connection terminal in a (j+1)th evaluation state is higher than the reference voltage, the fault detection circuit judges that the resistance value abnormality is present between the jth and (j+1)th connection terminals (where j is a natural number of (m−1) or less).

10. The light-emitting element driving device according to claim 1, wherein with each connection terminal cut off from the first and second nodes, a difference between the driving voltage and the second voltage is lower than a forward voltage across each light-emitting unit required to make it emit light.

11. The light-emitting element driving device according to claim 1, wherein a short circuit between the two connection terminals can constitute the resistance value abnormality between the two connection terminals.

* * * * *